(12) United States Patent
Morris et al.

(10) Patent No.: US 8,199,022 B2
(45) Date of Patent: Jun. 12, 2012

(54) TEST MODULE FOR MOTOR CONTROL CENTER SUBUNIT

(75) Inventors: Robert A. Morris, Fayetteville, NC (US); Scott E. McPherren, Wauwatosa, WI (US); Edgar Yee, Chapel Hill, NC (US)

(73) Assignee: Eaton Corporation, Cleveland, OH (US)

( * ) Notice: Subject to any disclaimer, the term of this patent is extended or adjusted under 35 U.S.C. 154(b) by 599 days.

(21) Appl. No.: 11/876,843

(22) Filed: Oct. 23, 2007

(65) Prior Publication Data

US 2008/0258667 A1 Oct. 23, 2008

Related U.S. Application Data

(60) Provisional application No. 60/891,831, filed on Feb. 27, 2007.

(51) Int. Cl.
*B60Q 1/00* (2006.01)
*H04Q 5/22* (2006.01)
*G08B 1/08* (2006.01)
*H02B 5/00* (2006.01)
*G01R 15/00* (2006.01)

(52) U.S. Cl. ..... 340/648; 340/439; 340/438; 340/10.34; 340/539.26; 361/615; 361/617; 361/627; 702/57; 702/60

(58) Field of Classification Search ............ None
See application file for complete search history.

(56) References Cited

U.S. PATENT DOCUMENTS

| | | |
|---|---|---|
| 3,303,395 A | 2/1967 | Eck |
| 3,469,043 A | 9/1969 | Wilson |
| 3,482,143 A | 12/1969 | Stark et al. |
| 3,495,135 A | 2/1970 | Paape |
| 3,626,253 A | 12/1971 | Sturdivan |
| 3,633,075 A | 1/1972 | Hawkins |
| 3,896,353 A | 7/1975 | Burton et al. |
| 4,024,441 A | 5/1977 | Coyle et al. |
| 4,038,585 A | 7/1977 | Wolski et al. |
| 4,068,287 A | 1/1978 | Kruzic et al. |
| 4,077,687 A | 3/1978 | Farag |
| 4,090,230 A | 5/1978 | Fuller et al. |
| 4,118,607 A | 10/1978 | Shaffer |
| 4,121,276 A | 10/1978 | Kovatch et al. |
| 4,178,624 A | 12/1979 | Wilson et al. |
| 4,180,845 A | 12/1979 | Shariff et al. |
| 4,233,643 A | 11/1980 | Iverson et al. |
| 4,292,661 A * | 9/1981 | Johnson et al. ............ 361/735 |
| 4,355,269 A | 10/1982 | Burton et al. |

(Continued)

FOREIGN PATENT DOCUMENTS

DE 10006427 C2 8/2001

*Primary Examiner* — Jennifer Mehmood
*Assistant Examiner* — Fekadeselassie Girma
(74) *Attorney, Agent, or Firm* — Ziolkowski Patent Solutions Group, SC

(57) ABSTRACT

A system and method are provided for coordinating the installation and removal a motor control center subunit with the power connection and interruption thereof. A system of interlocks and indicators causes an operator to install a motor control center subunit into a motor control center, and connect supply and control power thereto, in a particular order. Once installed, a test module system included with the subunit provides for pass-through connection of signals from equipment test points. The test module can thus relay internal conditions of the subunit to the operator without a need for disengaging or opening the subunit.

29 Claims, 17 Drawing Sheets

U.S. PATENT DOCUMENTS

| | | | |
|---|---|---|---|
| 4,427,854 A | 1/1984 | Kleinecke et al. | |
| 4,447,858 A | 5/1984 | Farag et al. | |
| 4,502,097 A | 2/1985 | Takahashi | |
| 4,621,303 A | 11/1986 | Rowe | |
| 4,652,966 A | 3/1987 | Farag et al. | |
| 4,693,132 A | 9/1987 | Buxton et al. | |
| 4,713,501 A | 12/1987 | Herrmann | |
| 4,728,757 A | 3/1988 | Buxton et al. | |
| 4,743,715 A | 5/1988 | Gerbert-Gaillard et al. | |
| 4,760,220 A | 7/1988 | Fritsch et al. | |
| 4,768,967 A | 9/1988 | Fritsch | |
| 4,789,344 A | 12/1988 | Fritsch et al. | |
| 4,789,919 A | 12/1988 | Cox et al. | |
| 4,853,830 A | 8/1989 | Corfits et al. | |
| 4,860,161 A | 8/1989 | Maki et al. | |
| 4,926,286 A | 5/1990 | Maki et al. | |
| 5,019,676 A | 5/1991 | Heckenkamp | |
| 5,337,210 A | 8/1994 | Ishikawa et al. | |
| 5,424,910 A | 6/1995 | Lees | |
| 5,424,911 A | 6/1995 | Joyner et al. | |
| 5,459,293 A | 10/1995 | Hodkin et al. | |
| 5,481,075 A | 1/1996 | Kleinecke et al. | |
| 5,486,663 A | 1/1996 | Fritsch et al. | |
| 5,495,388 A | 2/1996 | Bonetti et al. | |
| 5,510,960 A | 4/1996 | Rosen | |
| 5,530,414 A | 6/1996 | Reynolds | |
| 5,568,033 A | 10/1996 | Brunson | |
| 5,592,360 A | 1/1997 | Beck et al. | |
| 5,642,256 A | 6/1997 | Pugh et al. | |
| 6,015,958 A | 1/2000 | Pomatto et al. | |
| 6,087,602 A | 7/2000 | Bernier et al. | |
| 6,207,909 B1 | 3/2001 | Tallman et al. | |
| 6,284,989 B1 | 9/2001 | Bernier et al. | |
| 6,414,839 B1 | 7/2002 | Derksen | |
| 6,435,631 B1 | 8/2002 | Yee et al. | |
| 6,512,669 B1 | 1/2003 | Goodwin et al. | |
| 6,531,670 B1 | 3/2003 | Pugh | |
| 6,551,111 B1 * | 4/2003 | Watanabe | 439/11 |
| 6,700,062 B1 | 3/2004 | Allen, Jr. | |
| 6,717,076 B2 | 4/2004 | Narusevicius et al. | |
| 6,754,070 B2 * | 6/2004 | Chen | 361/679.26 |
| 6,831,226 B2 * | 12/2004 | Allen, Jr. | 174/53 |
| 6,845,301 B2 * | 1/2005 | Hamamatsu et al. | 700/292 |
| 6,861,596 B2 | 3/2005 | Schnackenberg | |
| 6,864,443 B1 | 3/2005 | Bruchmann | |
| 6,878,891 B1 | 4/2005 | Josten et al. | |
| 6,951,990 B1 | 10/2005 | Miller | |
| 7,019,230 B1 | 3/2006 | Vaill et al. | |
| 7,292,422 B2 | 11/2007 | Culligan et al. | |
| 7,311,538 B2 | 12/2007 | West | |
| 7,337,450 B2 * | 2/2008 | Sato et al. | 720/647 |
| 7,466,554 B2 * | 12/2008 | Matsumoto et al. | 361/724 |
| 7,471,505 B2 * | 12/2008 | Gull et al. | 361/627 |
| 7,525,809 B2 | 4/2009 | Bergmann et al. | |
| 7,544,908 B2 | 6/2009 | Webb et al. | |
| 2004/0166729 A1 | 8/2004 | Allen, Jr. | |
| 2004/0187597 A1 * | 9/2004 | Romano | 73/856 |
| 2004/0201972 A1 * | 10/2004 | Walesa | 361/788 |
| 2005/0083617 A1 * | 4/2005 | Blumenauer et al. | 361/42 |
| 2006/0067018 A1 | 3/2006 | Malkowski, Jr. et al. | |
| 2007/0040529 A1 * | 2/2007 | Takebayashi et al. | 318/685 |
| 2007/0047180 A1 * | 3/2007 | Wirtzberger et al. | 361/600 |
| 2007/0109736 A1 * | 5/2007 | Coglitore | 361/683 |
| 2007/0187263 A1 * | 8/2007 | Field et al. | 205/742 |
| 2008/0077280 A1 * | 3/2008 | DeBoer et al. | 700/295 |

\* cited by examiner

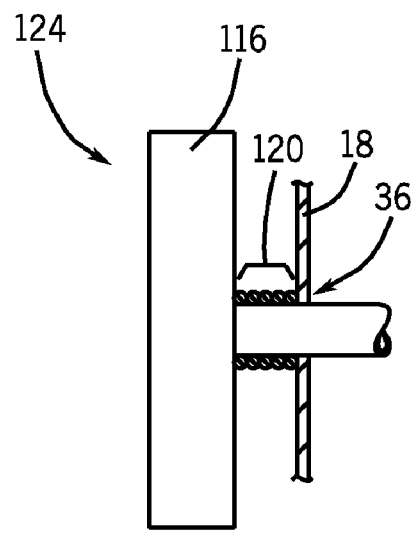
FIG. 14
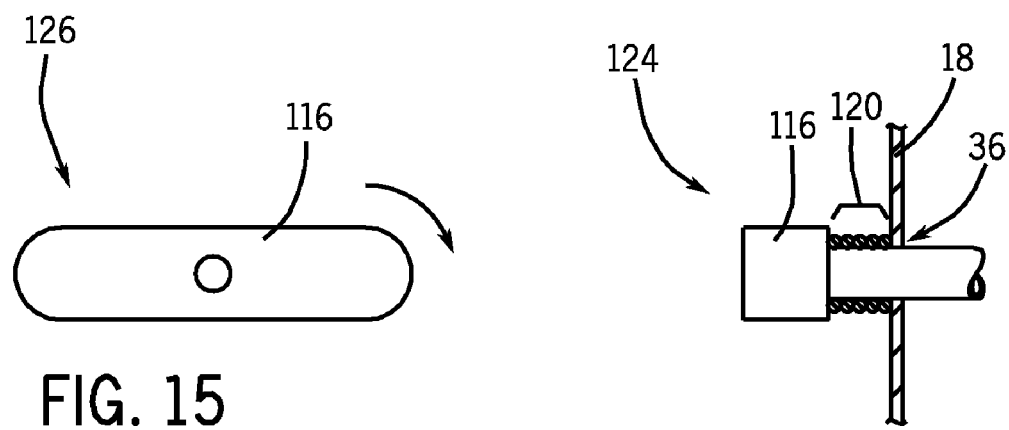
FIG. 15
FIG. 16

TEST MODULE FOR MOTOR CONTROL CENTER SUBUNIT

CROSS-REFERENCE TO RELATED APPLICATIONS

The present application claims the benefit of U.S. provisional application Ser. No. 60/891,831, filed on Feb. 27, 2007, the disclosure of which is incorporated herein by reference.

BACKGROUND OF THE INVENTION

The present invention relates generally to a system and method for motor control, and more particularly, to a test module for use with a subunit for a motor control center. The test module provides equipment connection points and voltage test points, so that a user can monitor internal conditions of the subunit when the subunit is installed into the motor control center. In one embodiment, the system and method described herein provide for connection of external accessories, such as motor meggaring devices, voltage/current testing equipment, and motor wellness units, to internal test points of the subunit, without a need for removing or opening the motor control center subunit.

A motor control center is a multi-compartment steel enclosure with a bus system to distribute electrical power, on a common bus system, to a plurality of individual motor control units mountable within the compartments. The individual motor control center subunits are commonly referred to as "buckets" and are typically constructed to be removable, pull-out units that have, or are installed behind, individual sealed doors on the motor control center enclosure. These buckets may contain various motor control and motor protection components such as motor controllers, starters, contactor assemblies, overload relays, circuit breakers, motor circuit protectors, various disconnects, and similar devices for electric motors. The buckets connect to the supply power lines of the motor control center and conduct supply power to the line side of the motor control devices, for operation of motors. Motor control centers are most often used in factories and industrial facilities which utilize high power electrical motors, pumps, and other loads.

Typically, when installing or removing motor control center buckets, the power supply lines are connected. To remove such a bucket, a deadfront door of the bucket or of the motor control center is opened and an operator manually pulls on the bucket to separate the primary disconnects, or "stabs," from the bus system, thereby disconnecting the power supply. Installation of a bucket is accomplished in a similar manner, wherein the operator manually pushes the bucket into a compartment of the motor control center to engage the bucket stabs with the bus system, thus connecting the system to supply power. The line connections or stabs may be difficult to maneuver manually when an operator is supporting the entire bucket or when the stabs are not visible.

Attempts have been made to improve upon the manual installation and disconnection of motor control center buckets and supply power connections from live supply power lines, risers, and/or a vertical bus of a motor control center. Other systems have employed pivotable handles inside the buckets to pivot line connectors to and from supply lines. However, many of these systems require that the bucket or compartment door be open to manipulate the handles and line stabs.

Similarly, once a bucket has been fully installed and/or sealed in place in a motor control center, it becomes difficult to monitor conditions inside the bucket without disconnecting the bucket and removing it from the motor control center. For example, in some systems, to test line or load voltages and currents, contactor or starter voltages and currents, and control signals, doors or seals of the bucket would need to be opened, or the bucket would be partially or completely removed.

It would therefore be desirable to design a motor control center bucket assembly that overcomes the aforementioned drawbacks. Thus, it would be desirable to provide for remote connection or disconnection of the line stabs of a bucket to the power supply lines or bus of a motor control center from a distance. In the event of an arc or arc flash, any heated gas, flame, and/or the arc itself should preferably be contained behind the bucket compartment door or "deadfront." It would further be desirable to include a test module which could convey conditions inside a fully installed bucket to an operator via an interface on an external side of the bucket.

BRIEF DESCRIPTION OF THE INVENTION

The present invention provides a system and method for installing a motor control center subunit or bucket into a motor control center and electrically connecting motor control components of the bucket to a power supply. The system and method utilize moveable line stabs to engage the power supply (such as a series of bus bars) after the bucket has been secured in the motor control center, in order to contain potential arc flashes. An arrangement of interlocks coordinates the connection of supply power with installation and removal of the bucket. A test module is disposed within the bucket and provides for indication of bucket operation characteristics after full installation of the motor control center subunit into the motor control center.

Therefore, in accordance with one aspect of the present invention, a motor control center subunit includes a housing and a base module disposed within the housing for through-door electrical connectivity and configured to relay at least one internal electrical condition of the subunit. The motor control center subunit also includes at least one base module accessory removably connectable to the base module and configured to receive at least one internal electrical condition of the subunit. The base module is configured to allow a user to determine at least one internal condition of the subunit to the accessory.

In accordance with another aspect of the invention, a motor control center includes a motor control center frame having at least one compartment and a motor control center subunit constructed to seat in the at least one compartment of the motor control center frame. The motor control center also includes an actuating mechanism attached to the motor control center subunit to control movement of a plurality of conductive line contacts and a subunit tester configured to relay a condition of the conductive line contacts outside the subunit to a user.

According to a further aspect of the invention, a method of manufacturing a base module for a motor control center includes the steps of constructing a motor control center subunit to seat within a motor control center and constructing a front panel for the motor control center subunit. The method also includes the steps of disposing a base module within the front panel and attaching test point connectors between the base module and at least one internal component of the motor control center subunit to convey signals indicative of operation conditions of the motor control center subunit.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 14 is a side view showing the control handle of FIG. 11 depressed into a motor control center subunit.

FIG. 15 is a plan view showing the control handle of FIG. 11 rotated ninety degrees.

FIG. 16 is side view of the control handle of FIG. 14.

DETAILED DESCRIPTION OF THE PREFERRED EMBODIMENT

The following description makes reference to supply power, supply power lines, motor power, load power, line power, and the like. It is appreciated that such terms may refer to a variety of both common and uniquely conditioned voltage and current characteristics, including but not limited to, three phase AC power, single phase AC power, DC power, multiple DC power lines, or any combination thereof. Such power characteristics will be generally referred to as being provided on a bus, supply line, or riser of a motor control center. However, it is appreciated that the present invention may find applicability in other power connectivity configurations, adapted or apart from motor control centers. An example of supply power commonly used in motor control centers is 480V three-phase AC power distributed over three separate supply bus bars. In addition, references to "motor control components" shall be understood to include the various types of devices and control components which may be housed in a motor control center bucket for connection to the supply power. Such devices and components include contactors, relays, motor controllers, disconnects, circuit protective devices, and the like.

Figure 1:
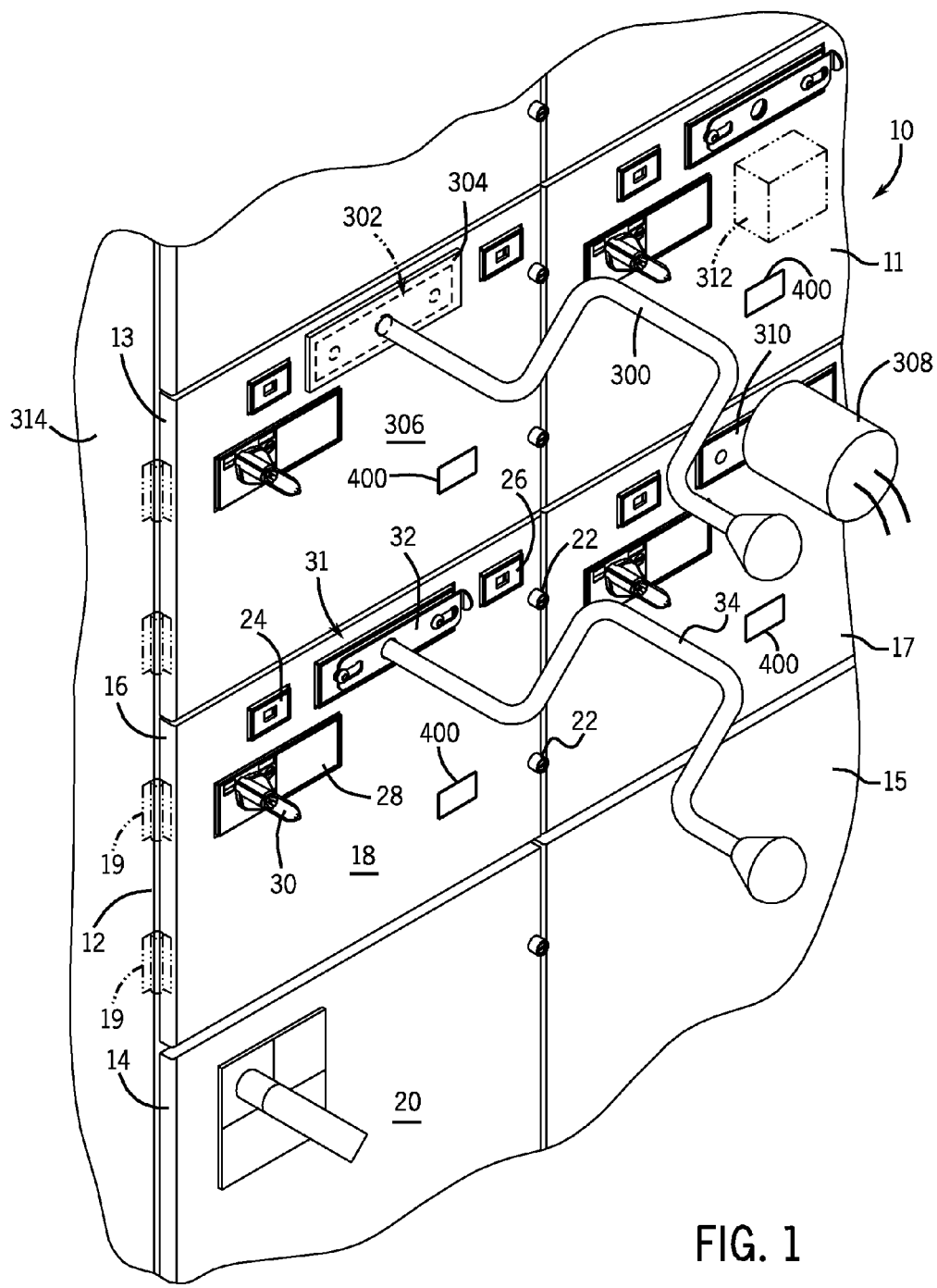
FIG. 1 is a partial perspective view of a number of motor control center subunits installed in a motor control center.

Referring to FIG. 1, a partial perspective view of a motor control center structure 10 is shown. As discussed above, motor control centers are generally formed of a frame 314 that may include compartments or enclosures for multiple control modules or buckets 11, 13, 14, 15, 16, 17. Bucket 16 is shown fully installed into motor control center compartment or enclosure 12 such that its front panel 18 is seated securely against the periphery of enclosure 12 and flush with the front panel 20 of bucket 14. In this regard, bucket 16 includes a number of latching mechanisms 22 on front panel 18 so that an operator may lock bucket 16 into place once installed. In some embodiments, front panel 18 may be a deadfront door having a set of hinges 19 in order to permit access to motor control components within bucket 16 while bucket 16 is installed in enclosure 12 of motor control center 10. However, even when closed or sealed, front panel or door 18 still permits access to circuit breaker assembly 28, stab indicator 24, shutter indicator 26, and line contact actuator 31. Line contact actuator 31 is a mechanism for engaging line contacts (FIG. 2) with line power from the motor control center 10. Thus, even when bucket 16 is fully installed in enclosure 12 and latches 22 have been secured, an operator may still use disconnect handle 30 and may open slide 32 to insert crank 34 to move one or more line contacts (not shown) of the bucket 16. When slide 31 is moved aside to permit access to actuating mechanism 31, door 18 is prevented from opening, thereby closing off access to components inside bucket 16. Additionally, a user may desire to padlock the slide 31 in the closed position, to further regulate who may operate actuating mechanism 31 and when.

In other embodiments, a crank 300 for actuating an actuating assembly 302 may include a flange 304 which abuts a front door 306 of a bucket 13 when the crank 300 is connected to the actuating assembly 302 thereof. Because the flange 304 extends further than the actuating assembly 302 and overlaps front door 306, flange 304 acts as an interlock to prevent door 306 from opening when the crank 300 is connected for operation of actuating assembly 302.

As an alternative to, or in combination with, using a hand crank, a motor drive 308 may be used to operate an actuating assembly 310 of a bucket 17. Such a motor drive 308 may be connected permanently or removably to actuating assembly 310. Preferably, motor drive 308 is a DC motor remotely operable from distances of 10-50 ft, whether wirelessly or with a wired controller. Motor drive 308 may be powered by a battery or by an electrical connection with motor control center 10, such as via the control power contact 44 shown in FIG. 2 or a similar plug or connection. It is recognized, however, that many other types, sizes, and configurations of motor drive 308 are equivalently applicable. For example, it may be desirable to connect a motor drive 312 inside a bucket, as shown with bucket 11. In addition, an interlock circuit may be included (not shown) to only allow operation of the motor drive 308, 312 when the bucket 11, 17 is installed in motor control center 10. This may be as simple as a contact switch that completes an input power circuit or may include more sophisticated position sensors or latch sensors.

A base module assembly 400 is also provided on front panel 18, to allow for attachment of various testing accessories (FIGS. 24-27) while bucket 16 is installed in the enclosure 12 of the motor control center 10 and front panel 18 is sealed. That is, base module assembly 400 may be configured as an electrical pass-through to convey voltages and currents from internal test points of the bucket 16 to access points on front panel 18. Alternatively, base module assembly 400 may be connected to convey signals which are merely indicative of internal conditions of the bucket 16, such as internal line and load voltages and currents, component temperatures, control voltages and currents, component conditions, and the like. These signals may be data signals which are processed to determine internal conditions, or may be scaled versions of the internal voltages or currents themselves. While shown as being located on a front surface of front panel 18, it is also envisioned that base module assembly 400 can also be positioned on a rear surface of front panel 18 to allow for additional ease in the diagnosis and troubleshooting of electrical issues in motor control center 10 or fixed permanently to motor control components (not shown) within bucket 16 and not on the front panel. When base module assembly 400 is fixed permanently within bucket 16 and not on front panel 18, a hole is cut in the front panel such that base module assembly 400 is accessible therethrough. When base module 400 is positioned on a front surface of front panel 18 (as shown in FIG. 1) and is not in use, it is envisioned that base module 400 be covered by a metal arc flash resistant cover (not shown) and locked with an appropriate locking mechanism, thus reducing chances of an arc flash and allowing access to base module 400 only by qualified personnel.

Figure 2:
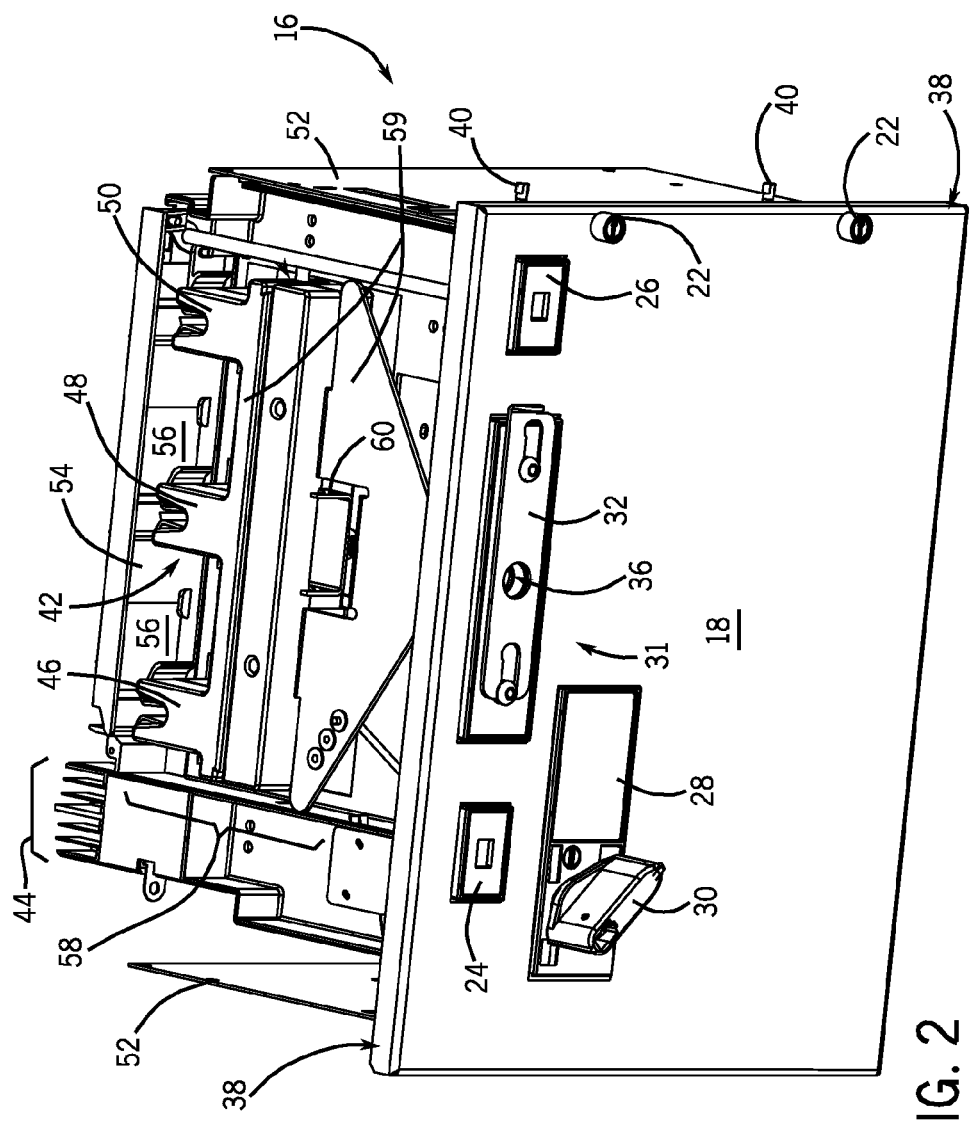
FIG. 2 is a perspective view of a motor control center subunit of FIG. 1, removed from the motor control center.

Referring now to FIG. 2, a perspective view of a motor control center bucket 16 is shown. It is noted that bucket 16 may have a housing that includes a number of panels surrounding bucket 16 to fully or partially enclose the components thereof. As shown, bucket 16 includes a pair of side panels 52 and a front panel 18, which support motor control devices and internal bucket components. An upper panel and a rear panel have been removed to show the internal components of bucket 16. Front panel 18 is configured to fit snugly and securely within a motor control center such that a rim 38 of the front panel 18 seats against the inner periphery (not shown) of a motor control center enclosure. For purposes of dust protection, rim 38 may optionally include a compressible or flexible seal, such as a rubber seal, or other gasket-type component. Once bucket 16 is inserted into a motor control center enclosure, latch mechanisms 22 may be turned with a key, a screwdriver, or by hand so that latch arms 40 abut an inner surface of the outer periphery (not shown) of an enclosure to hold bucket 16 in place and/or prevent bucket 16 from being removed. Similarly, an automatic retention latch 60 is shown in an engaged position. Upon advancement of line contacts or stabs 46, 48, 50 automatic retention latch 60 is triggered to engage a frame or divider pan (FIG. 7) that segregates upper and lower compartments of the motor control center unit in which bucket 16 is installed.

When slide 32 of line contact actuator 31 is moved aside, an opening 36 is exposed. Opening 36 preferably has a unique configuration to accept a specialized crank 34 (as shown in FIG. 1). Additionally, when slide 32 is moved aside as shown, slide 32 extends over a portion of front panel 18. Thus, in embodiments in which front panel 18 is a hinged door, moving slide 32 to expose opening 36 will inhibit a user from opening front panel 18. Accordingly, so long as an operator has a crank inserted into opening 36 of actuator 31, the operator cannot open the door of the bucket 16.

Bucket 16 also includes a number of conductive contacts or stabs 44, 46, 48, 50. Control power contact 44 is preferably fixedly attached to the rear of bucket 16, whereas supply power stabs 46, 48, 50 are moveable with respect to bucket 16. However, it is appreciated that control power contact 44 may also be moveable in a similar manner to line power stabs 46, 48, 50. Control power contact 44 is of a suitable construction to conduct a control power (typically a few volts) to motor control components (not shown) disposed within bucket 16. In embodiments where control power contact 44 is permanently positioned at the rear of bucket 16, control power contact 44 will engage a control power supply line or bus upon installation of bucket 16 into a motor control center.

Supply power stabs 46, 48, 50, on the other hand, do not initially engage supply power lines or buses when bucket 16 is installed into a motor control center. Rather, stabs 46, 48, 50 are initially in retracted position 42, disposed inside bucket 16. One skilled in the art will appreciate that a number of configurations of supply power stabs 46, 48, 50 may be utilized. In the embodiment shown, stabs 46, 48, 50 are shaped to grasp about a supply line, bus, or riser of the motor control center 10 of FIG. 1.

The stab assembly 58, in addition to stabs 46, 48, 50, also includes a stab bracket 59 to which the stabs 46, 48, 50 are attached. Stab bracket 59 holds stabs 46, 48, 50 in an orientation for subsequent engagement with the supply power lines or buses of motor control center 10 of FIG. 1. It is recognized, however, that stab assembly 58 of FIG. 2 may include any number of configurations, such as for independently moveable stabs, for other than three stabs, or for actuation by other than a shaft, as will be described below. A shutter or isolator assembly 54 is disposed in the rear of bucket 16, between stab assembly 58 and the exterior of bucket 16. Isolator assembly 54 includes a number of moveable shutters 56 which operate to either expose or isolate the stabs 46, 48, 50 from the power lines or buses of the motor control center 10 of FIG. 1.

Figure 3:
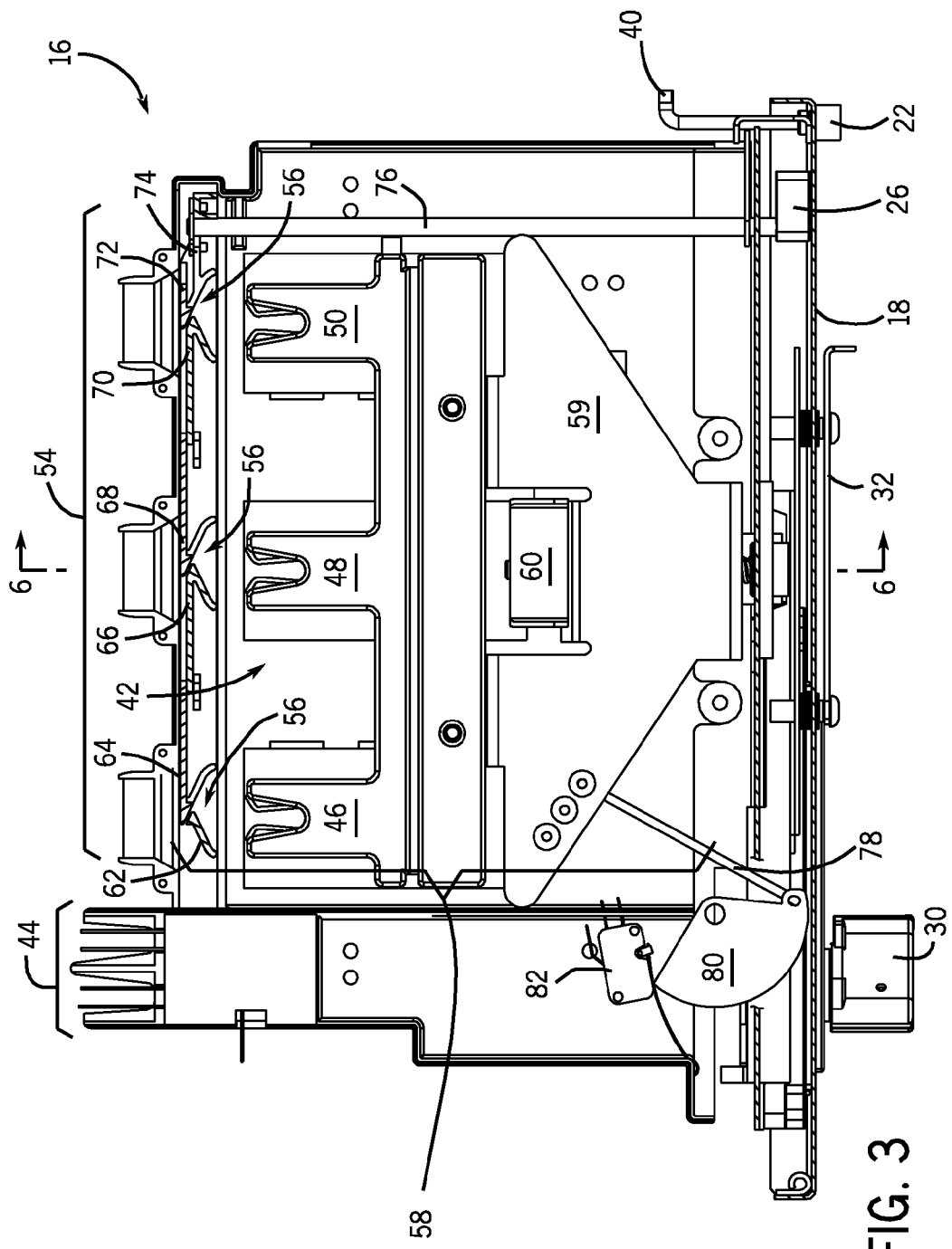
FIG. 3 is a top view of the motor control center subunit of FIG. 1 showing a number of stabs in a retracted position.

FIG. 3 depicts a top view of bucket 16, with all housing panels removed except for front panel or door 18. As shown, stab assembly 58 has positioned stabs 46, 48, 50 in a retracted position 42 wherein the stabs 46, 48, 50 are located inside bucket 16. Accordingly, shutters 56 of shutter assembly 54 are closed, isolating the stabs 46, 48, 50 from the supply power bus or line of a motor control center such as shown in FIG. 1. As shown in FIG. 3, each shutter 56 includes two separate shielding members 62 and 64, 66 and 68, 70 and 72. The shutter 56 for stab 46 includes a left shielding portion 62 and a right shielding portion 64, each being angled toward stab 46. Likewise the shutters 56 for stabs 48 and 50 include left shielding portions 66, 70 and right shielding portions 68, 72 respectively, each being angled toward the corresponding stab. However, the shutter 56 for stab 50 includes an additional mechanical connection 74. That is, a shutter arm 74 is provided to control a shutter indicating mechanism 76 which displays to an operator via front panel indicator 26 whether the shutters 56 are open or closed, as will be described in further detail below. Similarly, a cam or bell crank 80 is attached via rod 78 to stab assembly 58 to translate movement of the stab to a microswitch 82. Microswitch 82 operates to turn on and off the supply of control power from control power contact 44 to motor control components, such as contactors or overload relays (not shown), of bucket 16.

Figure 4:
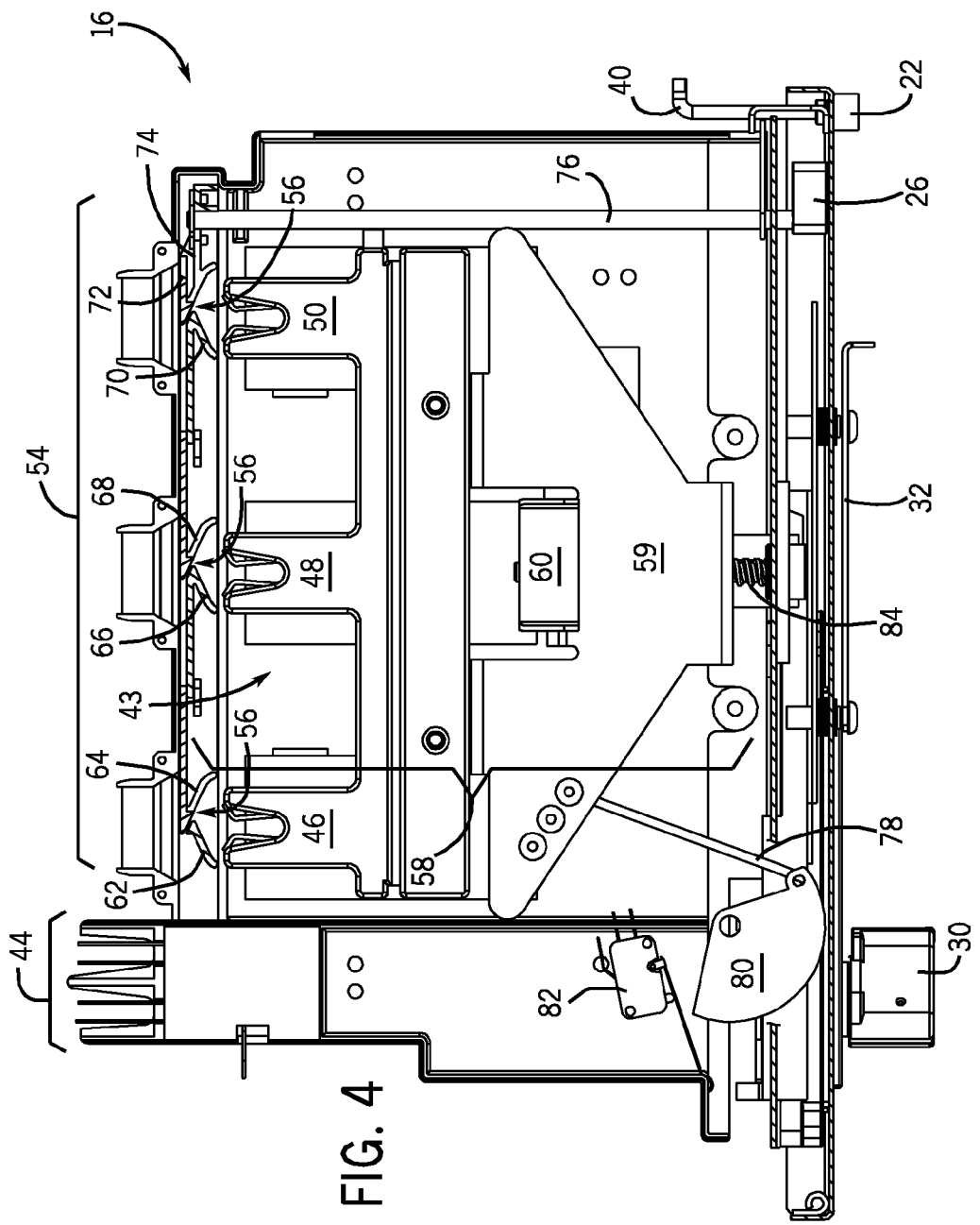
FIG. 4 is top view of the motor control center subunit of FIG. 3 showing the stabs in a test position.

Referring now to FIG. 4, the bucket 16 is shown having the stab assembly 58 in a test position 43. Stabs 46, 48, and 50 have been advanced to a point or test position 43 at which they nearly touch or just touch shutters 56, but shutters 56 are still closed. Since shutters 56 are closed, stabs 46, 48, 50 are isolated from supply power buses, thus preventing arcs from occurring between stabs 46, 48, 50 and the buses. Being in the test position, stab bracket 59 is moved forward such that actuating shaft or drive 84 is visible. Preferably, shaft 84 is a rotary drive shaft and is connected to the socket of opening 36 shown in FIG. 2 for operation via crank 34, shown in FIG. 1. Referring back to FIG. 4, during the advancement of stab assembly 58, automatic latch 60 has been triggered to engage the enclosure of the motor control center into which bucket 16 has been installed. Also due to the advancement of stab assembly 58, rod 78 is pulled by stab bracket 59 such that cam 80 has rotated away from microswitch 82. Microswitch 82 is thus actuated to permit control voltage from the control power contact 44 to a motor control component, such as a contactor or overload relay (not shown). It is appreciated, however, that microswitch 82, cam 80 and rod 78 are optional. In other words, embodiments of the present invention may simply permit control voltage to pass through control power contact 44 directly to motor control components immediately upon installation of bucket 16 into a motor control center when contact 44 engages a control power bus.

Figure 5:
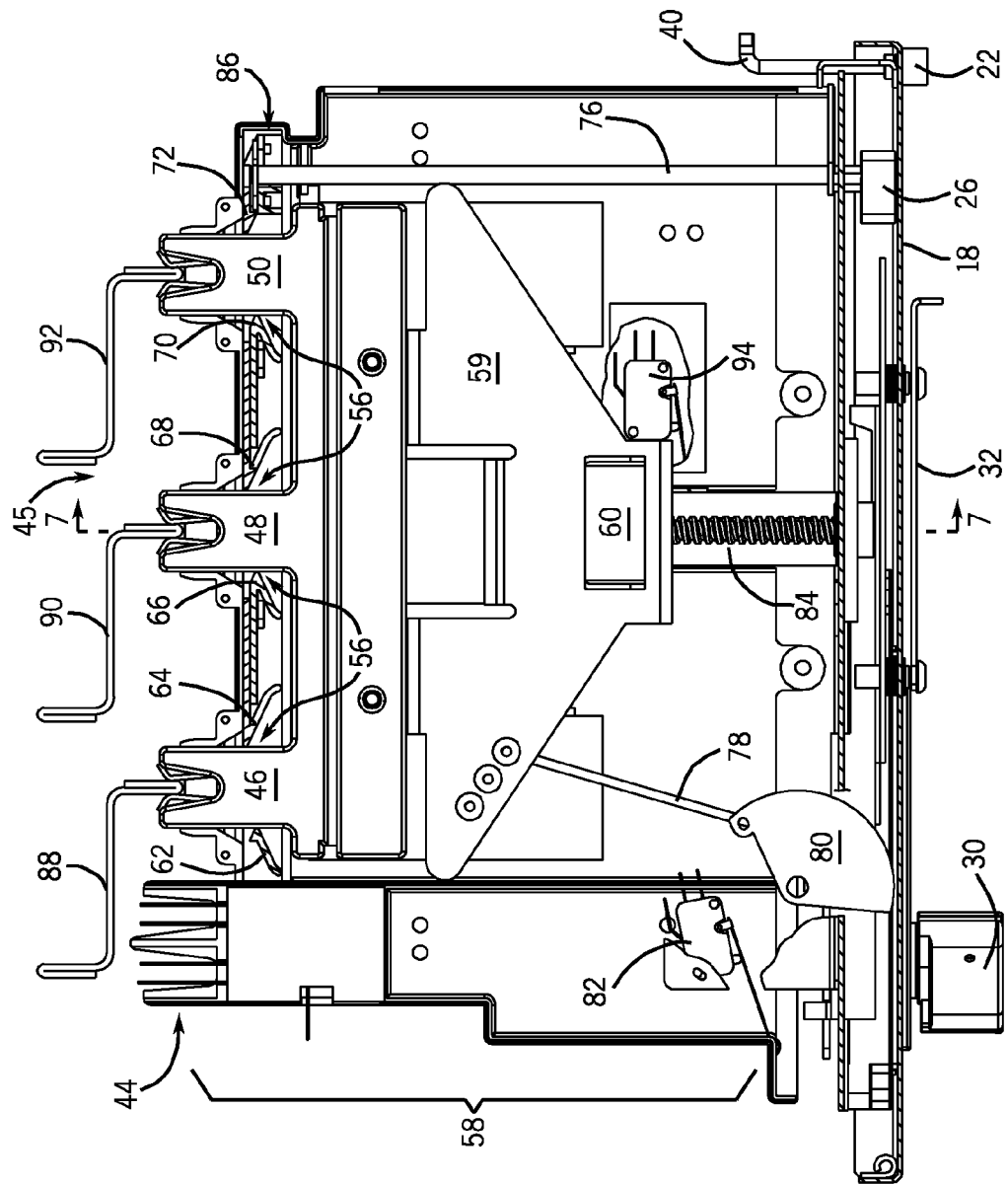
FIG. 5 is a top view of the motor control center subunit of FIG. 4 showing the stabs in an extended position.

FIG. 5 depicts another top view of the bucket 16 wherein the stabs 46, 48, 50 are in an extended/engaged position 45. In operation, stabs 46, 48, 50 are advanced or extended from the test position 43 of FIG. 4 towards shutters 56 and impinge upon angled portions 62-72 of the shutters 56. As the stabs 46, 48, 50 are forced forward into and against the surfaces of shutters 56, the stabs 46, 48, 50 separate the left angled portions 62, 66, 70 and right angled portions 64, 68, 72 of the shutters 56 to expose the stabs 46, 48, 50 to supply power buses 88, 90, 92, respectively. Preferably, a biasing or closure force is provided to bias the right angled portions 64, 68 72 and the left angled portions 62, 66, 70 towards one another, so that the shutters 56 automatically close upon retraction of stabs 46, 48, 50. It is recognized that numerous other ways of opening and closing shutters 56 are possible and contemplated. For example, rather than employing two shutter portions for each shutter, one shutter portion having one beveled surface could be slid aside by the advancement of the stabs. Or, the shutters could be connected for manipulation by the turning of rotary shaft 84. Thus, the shutters 56 could comprise one or several sliding panels with or without beveled surfaces. In other words, shutters 56 may be operated to open and close by the movement of the stabs, by the movement of the stab assembly, by the turning of the actuating shaft, by other actuating components, or by a manual control. Regardless, once the stabs 46, 48, 50 have penetrated through shutters 56, the stabs 46, 48, 50 may be advanced or extended to engage power supply bus bars 88, 90, 92.

Also shown in FIG. 5 is a second microswitch 94 connected to activate and deactivate circuit breaker 30. When stabs 46, 48, 50 reach the fully engaged position 45 with bus bars 88, 90, 92, stab bracket 59 of stab assembly 58 actuates microswitch 94. When actuated, microswitch 94 permits closure of circuit breaker 30, completing the circuit between bus bars 88, 90, 92 and the line side of motor control components (not shown) in bucket 16. Otherwise, microswitch 94 prevents closure of circuit breaker 30.

For removal of bucket 16, circuit breaker 30 is opened, disconnecting supply power to the motor control devices (not shown) of bucket 16. Stabs 46, 48, 50 may then be retracted from bus bars 88, 90, 92 by a reverse motion of rotary shaft 84. Once stabs 46, 48, 50 pass shutters 56, the right and left portions 62-72 thereof will automatically close together to isolate the stabs from bus bars 88, 90, 92. Preferably, the shutter portions 62-72 and all or some of the housing panels, including front panel 18 and a rear panel (not shown), of bucket 16 are formed of plastic or another insulating material. After stabs 46, 48, 50 have been fully retracted, automatic latch 60 will release from engagement with the motor control center, and an operator may then slide bucket 16 out of the motor control center.

Figure 6:
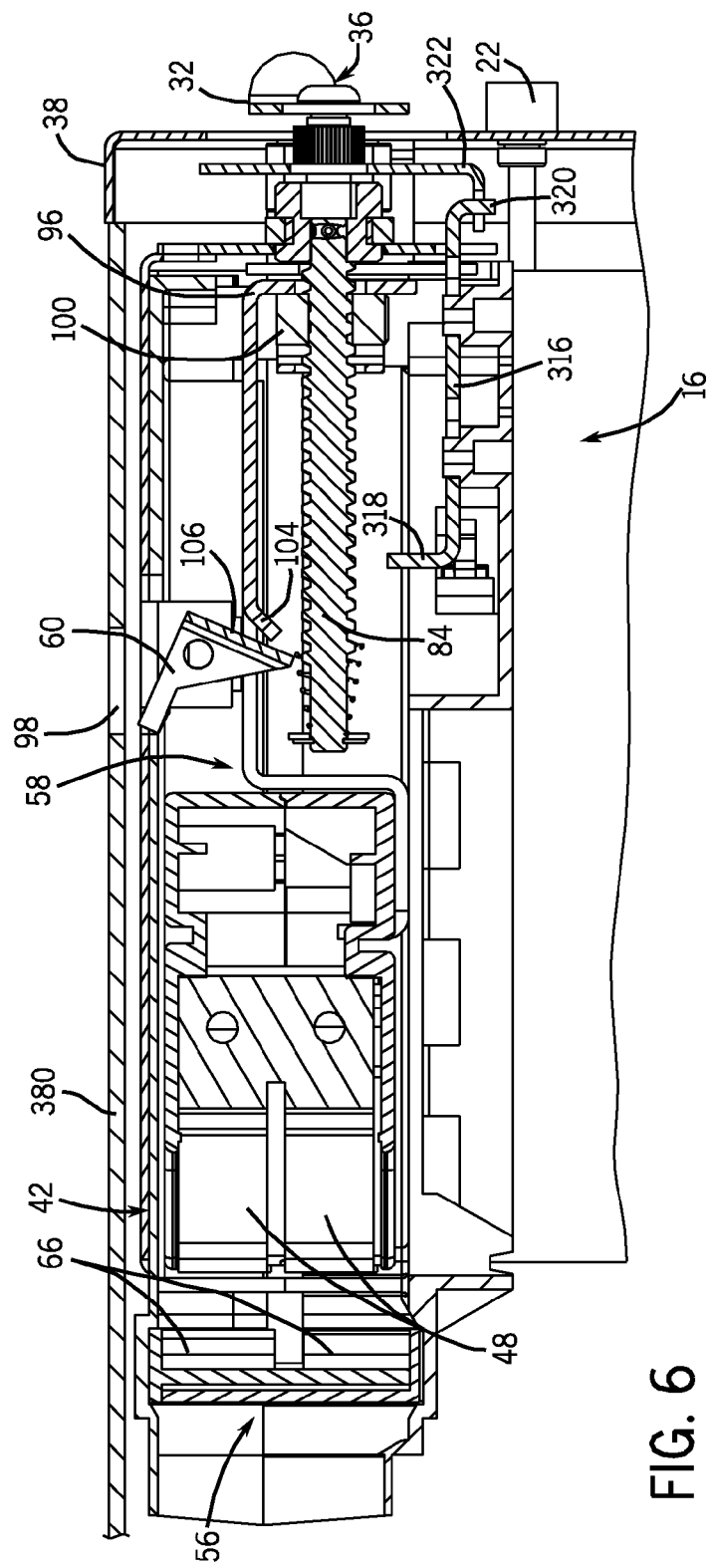
FIG. 6 is a cross-sectional view of the motor control center subunit of FIG. 3 taken along line 6-6 of FIG. 3.

Referring now to FIG. 6, a cross-sectional view of bucket 16 taken along line 6-6 of FIG. 3 is shown. The left angled portion 66 of a shutter 56 is shown isolating the central stab 48, since stab 48 is in the retracted position 42 of FIG. 3. In FIG. 6, it can be seen that stab assembly 58 holds stab 48 in position and engages rotary shaft 84, shown in section. Therefore, FIG. 6 illustrates the moving components used to actuate a stab 48. An operator may use a ratchet or crank (not shown) through opening 36 of slide 32 to turn rotary shaft or worm gear 84. A stab guide 96 includes a thread bearing 100 to transform the rotational motion of rotary shaft 84 into a translational motion of stab assembly 58. Thus, rotary shaft 84 and stab guide 96 may generally be referred to as a racking-type actuating mechanism for extending and retracting the stabs 46, 48, 50, relative to bucket 16. As stab assembly 58 is racked or otherwise advanced towards the extended or engaged position 45 shown in FIG. 5 (i.e. a motion to the left, as oriented in FIG. 6) stab 48 will impinge upon shutters 66.

FIG. 6 also illustrates the operation of a number of interlocks which coordinate installation of the bucket 16 with connection of supply power. That is, based upon the motion of the stab assembly 58, a retention latch 60 is triggered to retain bucket 16 in its installed position inside the motor control center frame 314, followed by a circuit breaker interlock 316 being moved to permit an operator to close circuit breaker handle 30 (FIG. 1). When stab assembly 58 is advanced, a sloped lip 104 of stab assembly 58 will strike a bottom portion 106 of automatic retention latch 60. As sloped lip 104 follows the advancing motion of the stab assembly 58, it will rotate retention latch 60 into an upward position wherein bottom portion 106 rests on stab guide 96 and latch 60 extends through a groove 98 of a divider pan 380 of the motor control center frame (FIG. 1) to retain bucket 16 therein. Additionally, in the embodiment shown, a circuit breaker interlock 316 mechanically prevents an operator from closing a circuit breaker 28 (FIG. 1) when stab assembly 58 is in the retracted position 42. This mechanical embodiment of circuit breaker interlock 316 may be used in addition to, or as an alternative to, the microswitch embodiment shown in FIG. 5. As shown in FIG. 6, circuit breaker interlock 316 has a downward-sloping end 320 and an upward-sloping end 318. The downward-sloping end 320 of circuit breaker interlock 316 acts as a stop, preventing plate 322 from shifting. Plate 322 is interconnected with circuit breaker handle 30 (FIG. 1), so that circuit breaker handle 30 cannot be turned unless plate 322 shifts.

Figure 7:
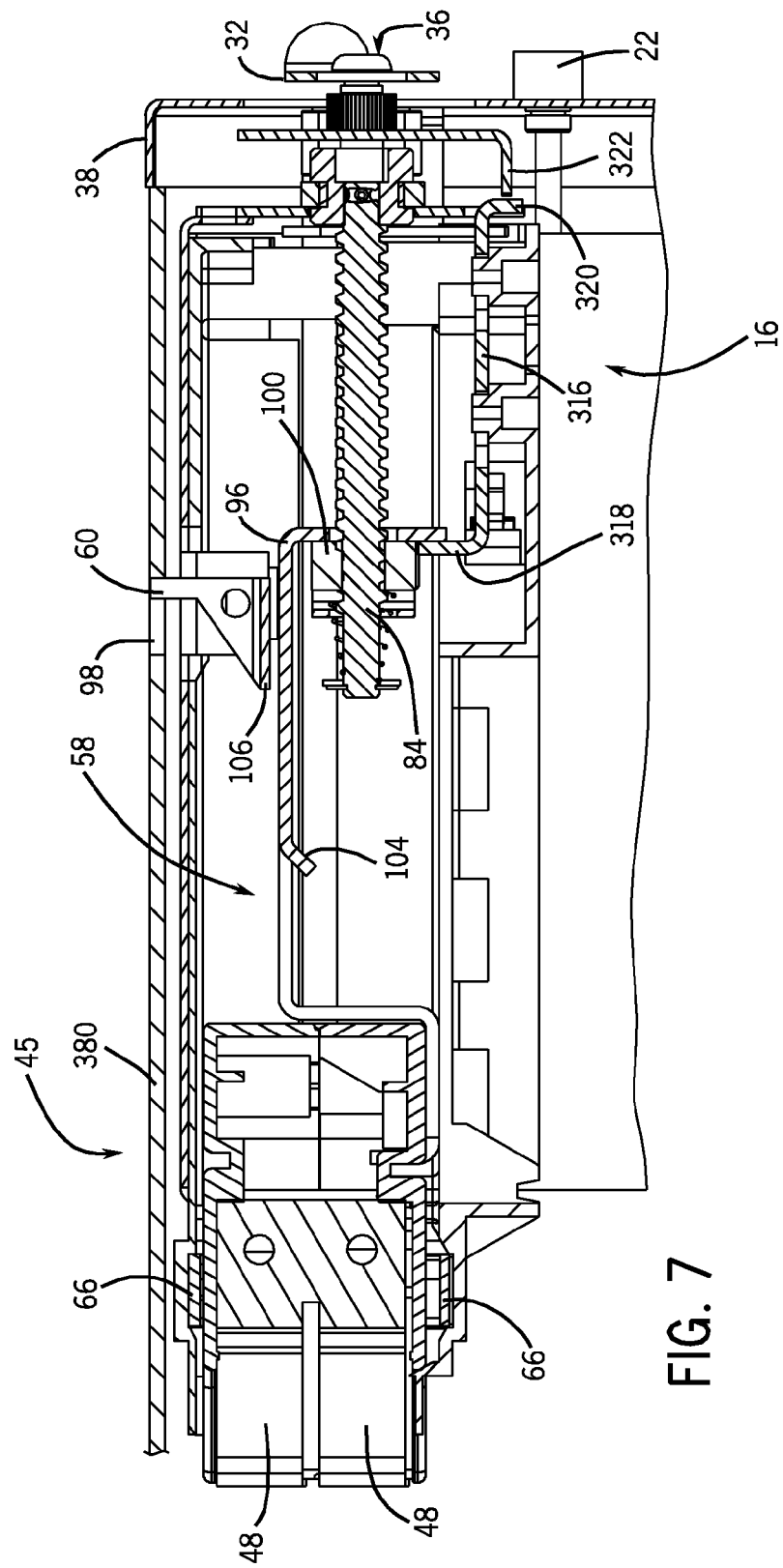
FIG. 7 is a cross-sectional view of the motor control center subunit of FIG. 5 taken along line 7-7 of FIG. 5.

FIG. 7 is another cross-sectional view, showing the same portion of bucket 16 as is shown in FIG. 6. However, FIG. 7 is a cross-section taken along line 7-7 of FIG. 5, thus showing component locations when the stab assembly 58 is in the extended position 45. Stab assembly 58 has been advanced by the turning of worm gear 84 such that stab 48 has separated and pushed past shutters 66. As the stab assembly 58 was advanced, sloped lip 104 of stab assembly 58 lifted bottom portion 106 of retention latch 60, such that retention latch 60 now engages a divider pan 380 through opening 98. Divider pan 380 is connected to the motor control center frame (FIG. 1) to separate two bucket compartments thereof. Thereafter, as the stab assembly 58 reached its fully extended position 45, the stab guide 96 abutted the upward-sloped end 318 of circuit breaker interlock 316, drawing circuit breaker interlock 316 away from plate 322. Thus, downward-sloped end 320 of circuit breaker interlock 316 no longer blocks shifting of plate 322 when stab assembly 58 is in the extended/engaged position 45. In other words, installation and power connection are coordinated in that a user cannot remove the bucket 16 from the motor control center once the automatic retention latch is triggered, and can only turn the circuit breaker handle 30 (FIG. 1) when the stab assembly reaches its extended position 45.

Figure 8:
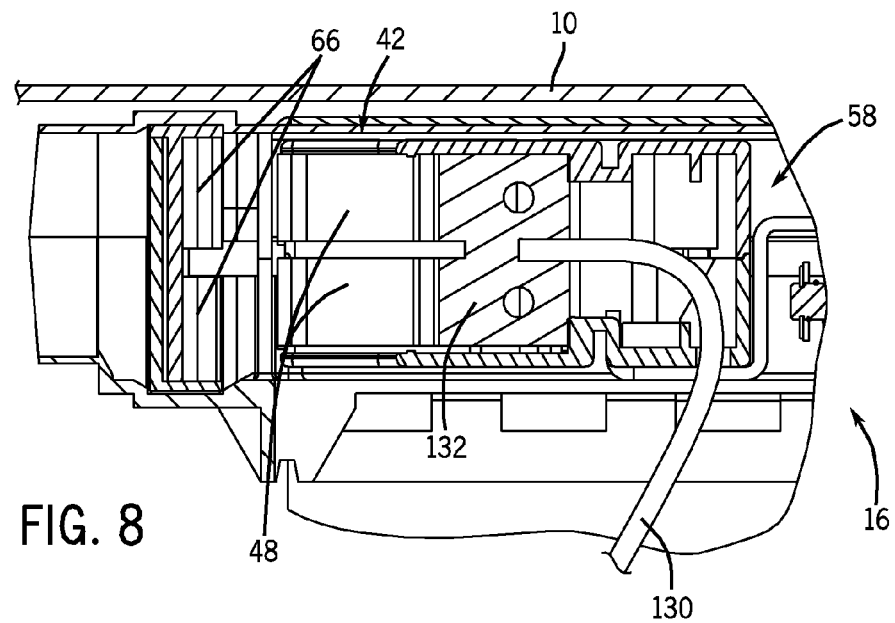
FIG. 8 is a detailed view of a portion of the motor control center subunit of FIG. 6 showing an arc shield, line contact, and supply conductor thereof.
Figure 9:
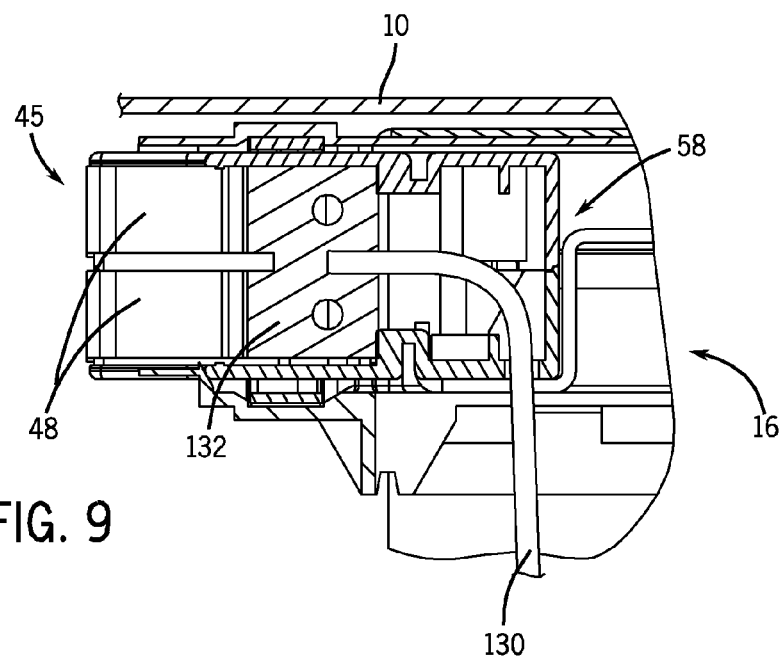
FIG. 9 is a detailed view of a portion of the motor control center subunit of FIG. 7 showing a line contact and supply conductor thereof.

FIG. 8 is an enlarged view of the stab 48 and shutter 66 area of the cross-sectional view of FIG. 6. Conductive stab 48 is coupled to a flexible conductor 130, such as a cable, via a coupling portion 132 of stab assembly 58. Flexible conductor 130 is of a construction suitable to conduct supply power, via stab 48, to the line side of a motor control component (not shown). As shown in FIG. 9, when stab 48 and stab assembly 58 are racked or otherwise advanced forward to an extended position 45, flexible conductor 130 flexes to maintain electrical connectivity with stab 48 via coupler 132. Accordingly, the motion of stab 48 relative to bucket 16 does not interfere with the connectivity of the stab 48 with a motor control component.

Figure 10:
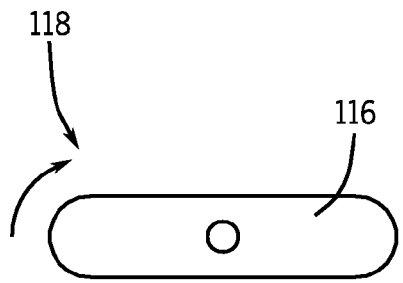
FIG. 10 is a plan view of a control handle of one embodiment of the present invention.
Figure 11:
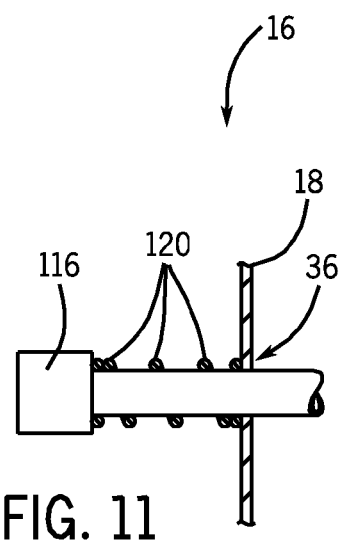
FIG. 11 is a side view of the control handle of FIG. 9.
Figure 12:
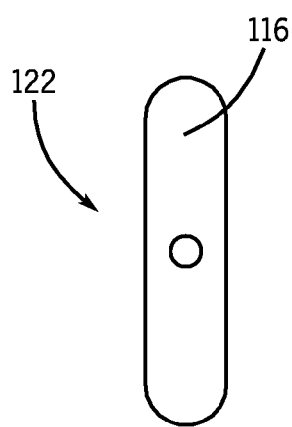
FIG. 12 is a plan view showing the control handle of FIG. 9 rotated ninety degrees.
Figure 13:
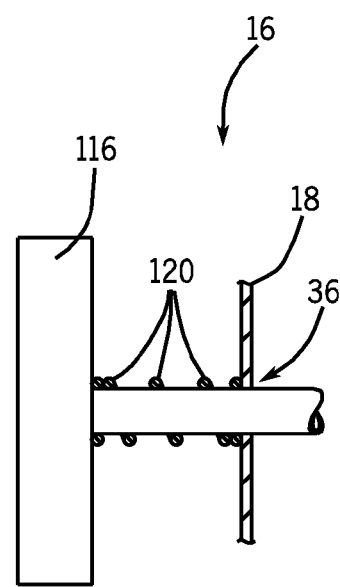
FIG. 13 is a side view of the control handle of FIG. 11.

Referring now to FIGS. 10-16, an alternative stab actuating feature is shown. A manually drivable handle 116 may replace or be used in combination with the crank 34, the crank 300, the motor drive 308, or the motor drive 312 of FIG. 1 and the racking mechanism of FIG. 6. In such embodiments, the rotary shaft or worm gear 84 depicted in previous embodiments may be replaced with a non-tapped shaft or rod directly connected to stab assembly 58. FIG. 10 shows such a handle 116 in a locked, starting position 118 that corresponds to the stabs disengaged position 42 of FIG. 3. As shown in FIG. 11, handle 116 is separated and biased from front panel 18 of a bucket by a spring 120 and extends through stab actuating opening 36. By rotating handle 116 ninety degrees, as shown in FIGS. 12 and 13, handle 116 may be unlocked 122. In some embodiments, an interlock system may be included to prevent unlocking of handle 116 until bucket 16 is fully installed into a motor control center. Such an interlock may be incorporated into the shaft 84 of handle 116. Once unlocked, handle 116 may be driven or depressed towards front panel 16, compressing spring 120, as shown in FIG. 14. The depressed position 124 of handle 116 corresponds to the stabs engaged position of FIG. 5. Handle 116 may then be rotated another ninety degrees 126, as shown in FIGS. 15 and 16, to lock the handle in the stabs engaged position 124, against the force of spring 120. For disengagement of the stabs, handle 116 is rotated to unlocked orientation 122, pulled outward to the stab disengaged position 42 and turned ninety degrees to a locked position 118. In a general sense, therefore, embodiments of the present invention may include various configurations of simplified, manual actuation of the stabs, similar to that shown in FIGS. 10-16.

Figure 17:
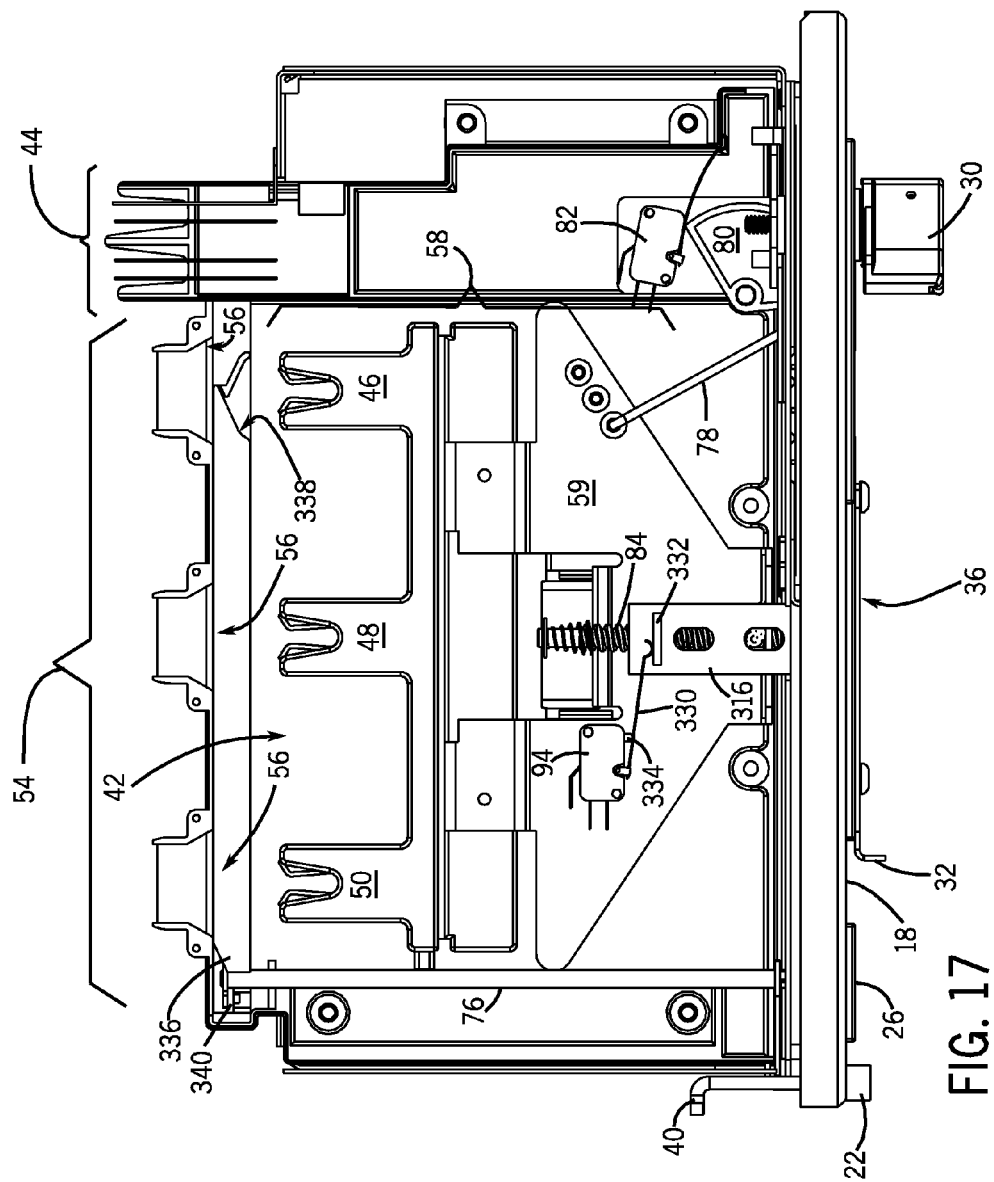
FIG. 17 is a bottom view of the motor control center subunit of FIG. 3.

Referring now to FIG. 17, a bottom view of the bucket 16 of FIG. 3 is shown, wherein the stab assembly 58 and stabs 46, 48, 50 are in a retracted position 42. In retracted position 42, shutters 56 of shutter assembly 54 are closed, isolating or shielding stabs 46, 48, 50 inside bucket 16. Control power stab 44, on the other hand, is un-shielded and will be connected to a control power once bucket 16 is installed into a motor control center. However, microswitch 82 is in an activated state, due to the pressure thereon by cam 80. When microswitch 82 is in the activated state, as shown, microswitch 82 is interrupting control power from contact 44. Thus, the motor control components (not shown) housed in bucket 16 cannot initially be operated. Cam 80 will be moved by rod 78 via advancement of stab bracket 59, deactivating microswitch 82 and thereby permitting the flow of control power to motor control components (not shown) of the bucket 16. Cam 80 also acts to display a location status of the stabs 46, 48, 50 to an operator. As will be discussed below, cam 80 has a number of colors printed thereon which are displayed through front door 18 of bucket 16 via stab indicator 24 (FIG. 1).

In the embodiment shown, circuit breaker interlock 316 includes microswitch 94, which gates the operation of circuit breaker 30. FIG. 17 shows microswitch 94 in a deactivated state, in which button 334 thereof is not depressed. Arm 330 of microswitch 94 is positioned to abut a ledge 332 of circuit breaker interlock 316 Thus, when circuit breaker interlock 316 moves, due to the motion of stab assembly 58, the arm 330 of microswitch 94 will pivot, depressing button 334. When button 334 is depressed, microswitch 94 will be activated and will electrically enable operation of circuit breaker 28 (FIG. 1).

Also shown in FIG. 17 is a shutter arm 336, having a sloped end 338. As stab 46 is advanced, stab 46 will engage the sloped end 338 and slide past shutter arm 336, thereby shifting shutter arm 336 to the left, as depicted in FIG. 17. When shutter arm 336 is shifted, it will strike a tab 340 of rod 76. As will be further described below, when tab 340 is struck, rod 76 will rotate, changing the color showing on shutter indicator 26 through door 18 of bucket 16.

Figure 18:
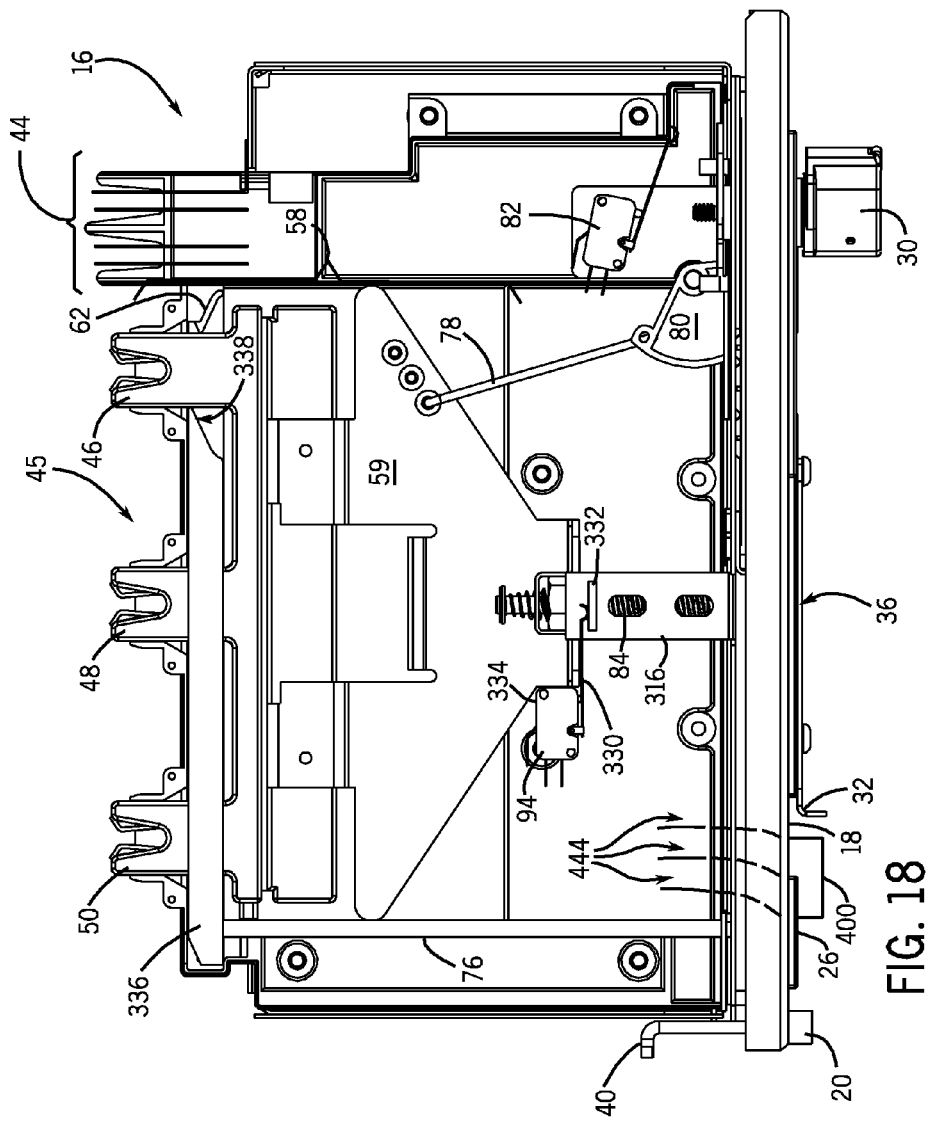
FIG. 18 is a bottom view of the motor control center subunit of FIG. 5.

FIG. 18 is a bottom view of the bucket 16 of FIG. 5, illustrating the location of components thereof when the stab assembly 58 is in the extended/engaged position 45. When stab assembly 58 was advanced, rod 78 caused cam 80 to rotate, releasing pressure on microswitch 82. Thus, microswitch 82 is shown in a deactivated state, permitting the flow of control power from control power contact 44 to motor control components (not shown) of bucket 16. Additionally, the advancement of stab assembly 58 moved circuit breaker interlock 316 such that ledge 332 thereof drew arm 330 of microswitch 94 to an activated position. That is, arm 330 of microswitch 94 is depressing button 334 to enable operation of circuit breaker 30, now that stabs 46, 48, 50 are in the engaged position 45.

As discussed above, the advancement of stabs 46, 48, 50 to the extended position 45 separates a number of shutter portions, including shutter portion 62. In the embodiment shown in FIG. 18, the advancement of stab 46 also caused a shift in shutter arm 336. That is, stab 46 impinged upon sloped end 338 of shutter arm 336 and drove shutter arm 336 to the left, as depicted in FIG. 18, as stab 46 advanced. When shutter arm 336 shifted due to the motion of stab 46, shutter arm 336 struck a tab 340 (FIG. 17) of rod 76, rotating rod 76 and altering the color of shutter indicator 26.

Also shown in FIG. 18 are test point connections 444, which are connected from the base module assembly 400 on a front panel 18 of the motor control center 10 to various connection points within the bucket 11. It is contemplated that the internal connection points or voltage test points of the test point connections 444 may include locations on control power contact 44, stab assembly 58, shutter assembly 54, circuit breaker assembly 28, short circuit protection devices (not shown), starters and other internal control components (not shown), and other locations of interest within the motor control center 10.

Figure 19:
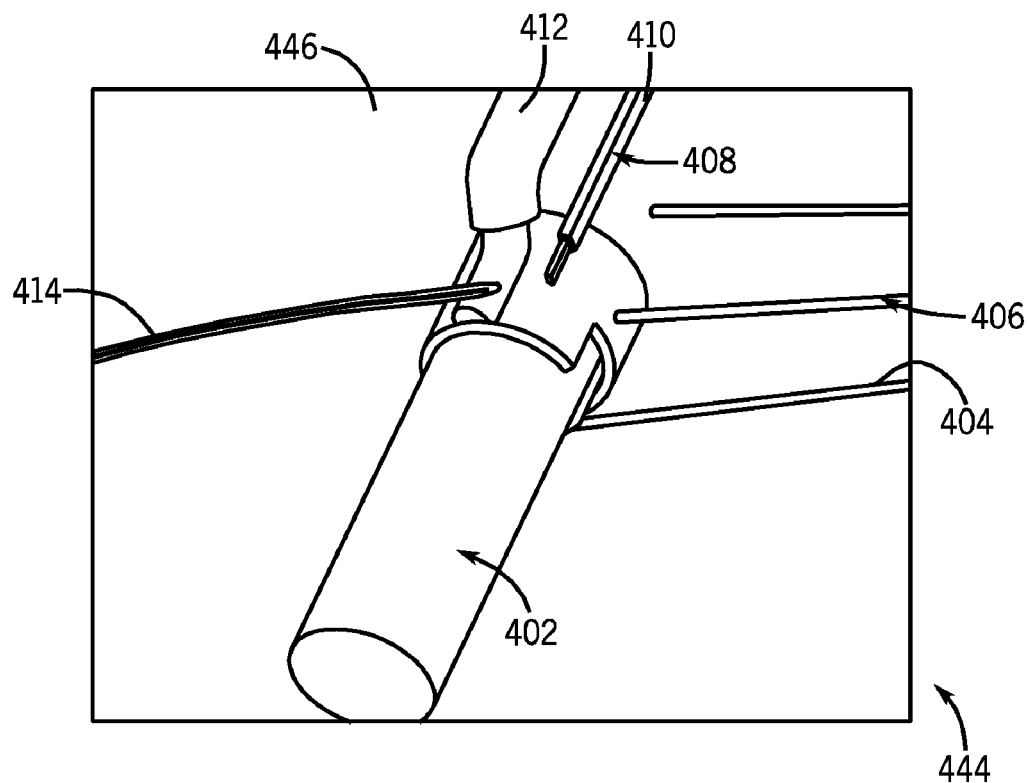
FIG. 19 is a perspective view of a test point connection.
Figure 25:
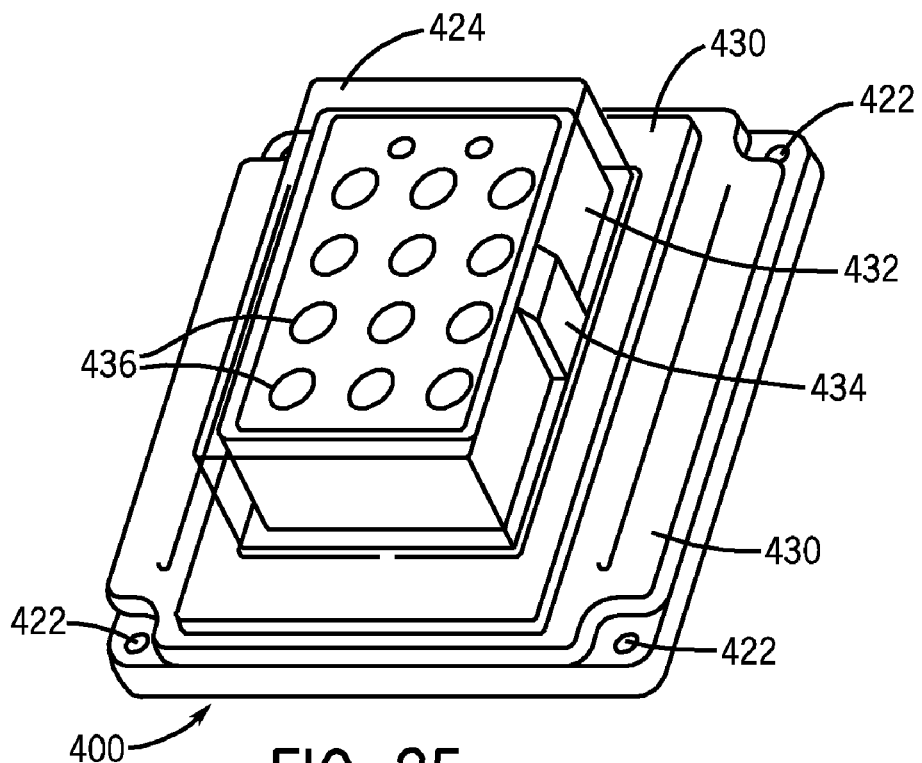
FIG. 25 is a front perspective view of the base module assembly of FIG. 24 with an attached accessory and cover.
Figure 26:
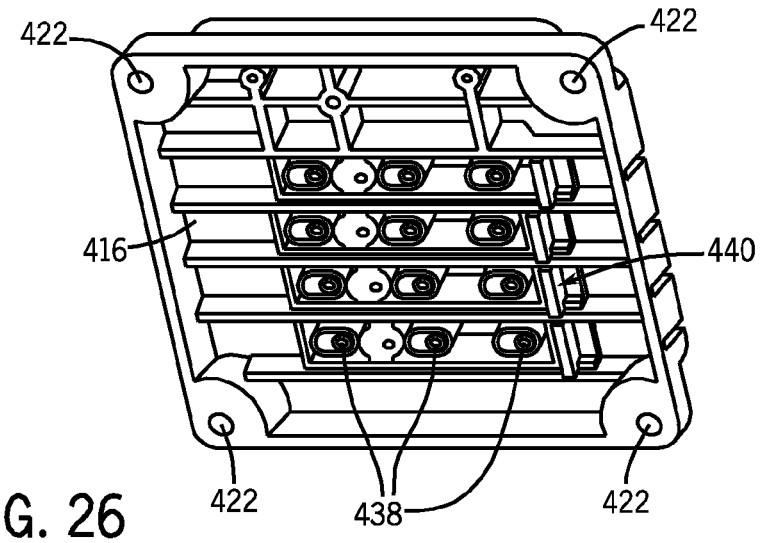
FIG. 26 is a rear perspective view of an integrated voltage test point accessory and base module.
Figure 27:
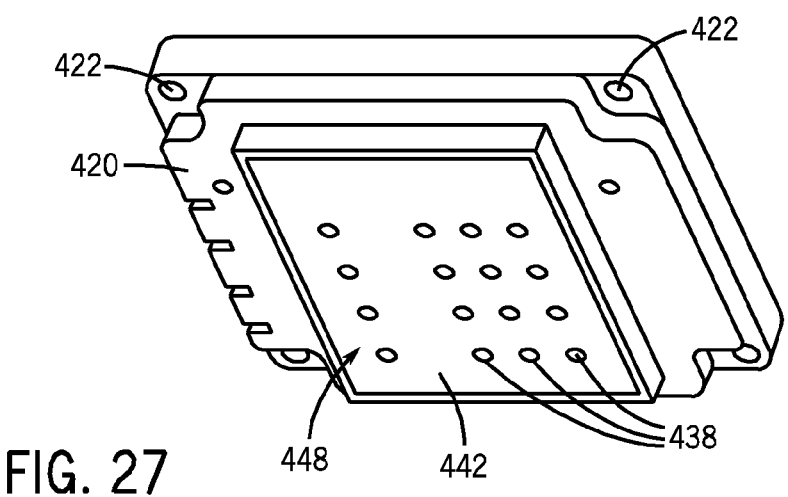
FIG. 27 is a front perspective view of the integrated voltage test point accessory and base module of FIG. 26.

A detailed perspective view of a test point connection 444 is shown in FIG. 19. Test point connection 444 comprises a wire connection or primary wire 402, which interfaces with a voltage point in the bucket 11, and a voltage sensor 446. The voltage sensor 446 comprises a voltage sensing wire 412 that reads out to an accessory (FIGS. 25-27). Voltage sensing wire 412 is preferably soldered to a spring clip 406, which is constructed of an easy-to-solder-to metal and sized to match the diameter of the primary wire 402. It is recognized, however, that many ways exist to attach voltage sensing wire 412. Spring clip 406 assembles with primary wire 402 using tabs 404 that slide over the end of the primary wire 402. Once released, tabs 404 spring tight and hold the voltage sensor 446 in place with the primary wire 402. After voltage sensor 446 is installed on the primary wire 402, an insulator, such as electrical tape 408 for example, is wrapped around the primary wire 402 and spring clip 406 for dielectric insulation. Preferably, test point connection 444 is insulated to an extent that additional finger protection may not be needed. It is recognized, however, that any desired level of insulation may be incorporated into test point connection 444.

Optionally, a temperature sensor, such as a thermocouple 410, may be placed on the voltage sensor 446 and secured with electrical tape 408 or via any other connecting/insulating techniques. In this regard, it is recognized that any number of voltage sensing wires 412 and thermocouples 410 may be then bundled together to be connected to the back side 416 of an accumulation module or base module assembly 400. Similarly, it will be appreciated that thermocouple 410 and voltage sensor 446 may be selected to minimize interference with the signals of primary wire 402.

Figure 20:
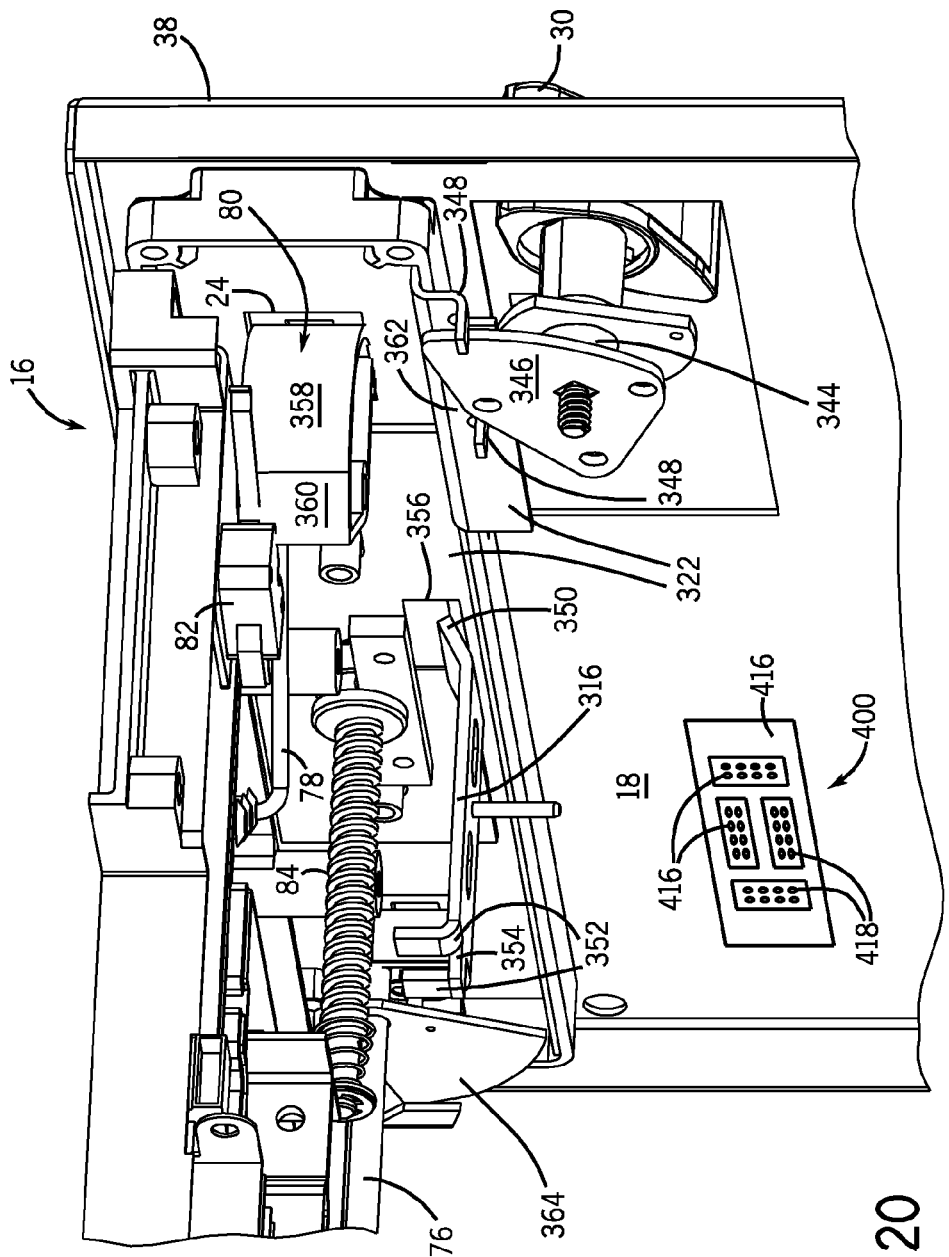
FIG. 20 is a rear perspective view of the motor control center subunit of FIG. 2.

Referring now to FIG. 20 a partial interior perspective view of a motor control center bucket 16 is shown. For purposes of illustration, several components are not shown, including side panels, a top panel, a stab guide, and a circuit breaker assembly. Therefore, circuit breaker handle 30 is visible through front door 18 of bucket 16. As shown, handle 30 is attached via a shaft 344 to a fin 346. Though not shown, a circuit breaker assembly is also attached to be actuated by shaft 344.

Circuit breaker interlock 316 is shown in an alternate configuration, having an upward-sloping end 350 near door 18 and a pair of vertical tines 352 and one horizontal tine 354 at an opposite end. Vertical tines 352 are engaged by a stab guide 96 (FIG. 7) when the stabs of bucket 16 are advanced. Horizontal tine 354 engages a spring (not shown) to bias the circuit breaker interlock 316 toward door 18 until the stabs of bucket 16 are advanced. Until the circuit breaker interlock 316 is slid away from door 18 by advancement of the stabs, upward-sloping end 350 of circuit breaker interlock 316 is inserted into an opening 356 of interlock plate 322. Because upward-sloping end 350 is inserted into opening 356, interlock plate 322 is prevented from shifting side-to-side, until circuit breaker interlock 316 is pulled away from door 18 by the advancement of the stabs of bucket 16.

Interlock plate 322 has a projection 362 extending therefrom to fin 346 of circuit breaker handle 30. Projection 362 is integrally formed with, or affixed to, plate 322, and is configured to move side-to-side with plate 322, when upward-sloping end 350 of circuit breaker interlock 316 is not inserted in opening 356. Projection 362 has a pair of tines 348 which extend outwardly therefrom, on either side of fin 346. Therefore, when plate 322 is prevented from moving, tines 348 prevent fin 346 from rotating, thereby preventing an operator from turning circuit breaker handle 30. In this manner, circuit breaker interlock 316 prevents a user from closing circuit breaker handle 30 until the stabs of bucket 16 are fully extended. It is understood that circuit breaker interlock 316, interlock plate 322, and associated components may have a number of shapes, orientations, and configurations which allow for the functionality described herein.

When an operator closes circuit breaker handle 30, fin 346 impinges upon the tines 348 of projection 362 in a counter-clockwise direction. The force of fin 346 on tines 348 causes projection 362 and interlock plate 322 to shift to the left, as orientated in FIG. 20. When plate 322 shifts left, it obscures opening 36 of actuating assembly 31 (FIG. 1), obstructing access to worm gear 84. So long as circuit breaker handle 30 is closed, fin 346 will prevent plate 322 from moving back to the right, as shown in FIG. 20. In other words, fin 346 of circuit breaker handle 30 effectively prevents a user from moving the stabs of bucket 16 while the circuit breaker is closed and supply power is conducting. Once circuit breaker handle 30 is opened again, fin 346 will not press on tines 348, plate 322 will be permitted to shift back to the position shown in FIG. 20, and an operator will again have access to worm gear 84. When the operator reverses worm gear 84 to withdraw the stabs, circuit breaker interlock 316 will be biased back toward plate 322, preventing plate 322 from sliding, and thus preventing circuit breaker handle 30 from turning.

Also shown in FIG. 20 is cam 80 and rod 78. As discussed above with respect to FIGS. 3 and 4, rod 78 is connected to translate movement of the stabs of bucket 16 to a rotational motion of cam 80. Cam 80 serves two purposes: to activate and deactivate microswitch 82, as described above, and to control the stab location status shown on stab indicator 24. Therefore, cam 80 has a number of colors printed on its edge. Visible in FIG. 20 are a red edge section 360 and a yellow edge section 358. A green edge section (not shown) is currently being presented at stab indicator 24, to indicate the stabs retracted position 42 of FIG. 3. Yellow edge section 358 will be presented at stab indicator 24 when the stabs have left the retracted position and are advanced towards the test position 43 of FIG. 4. Red edge section 360 will be presented at stab indicator 24 when the stabs have reached the extended/engaged position 45 of FIG. 5.

Similarly, rod 76 of shutter indicator 26 (FIG. 4) is connected to a wheel 362, which presents a number of colors at shutter indicator 26, to indicate the status of the shutter assembly 54 (FIG. 3). That is, as described with respect to FIG. 18, the movement of stab assembly 58 causes a rotation in rod 76. As depicted in FIG. 20, rod 76 is affixed to wheel 364 such that a rotation of rod 76 causes wheel 364 to turn.

FIG. 20 also shows the back side 416 of the base module assembly 400 as it is integrated with the front panel 18 of the bucket 16. In one embodiment of the current invention, internal test point connection ports 418 for both voltage sensing wires 412 and thermocouples 410 are arranged on the back side 416 of the base module 400. In other embodiments, the back side 416 of base module 400 may include connections for only one or for several voltage sensing wires 412 or only one or several thermocouples 410. Although internal test point connection ports 418 have been described for voltage and temperature sensing applications, it is contemplated that internal test point connection ports 418 may be provided to accumulate and output other data from the bucket 16, such as insulation characteristics, motor wellness characteristics, and other characteristics of operation.

Figure 21:
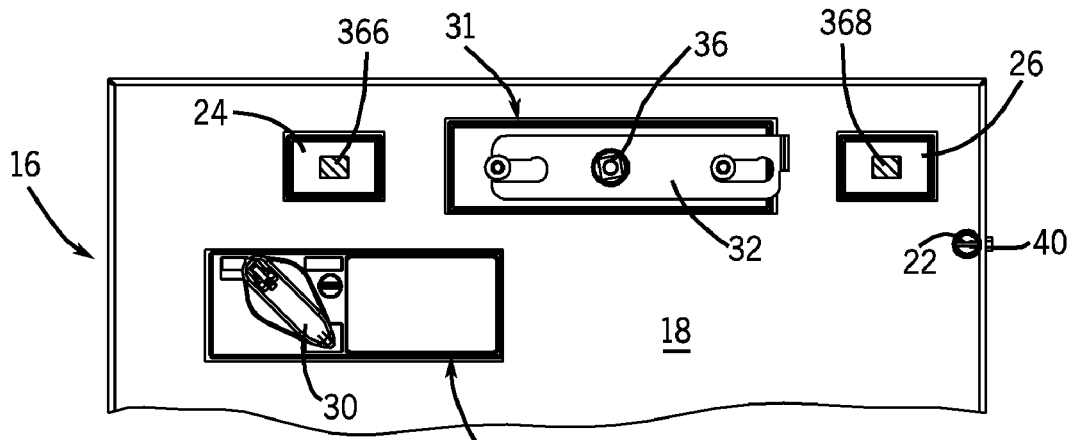
FIG. 21 is a front view of the motor control center subunit of FIG. 3.
Figure 22:
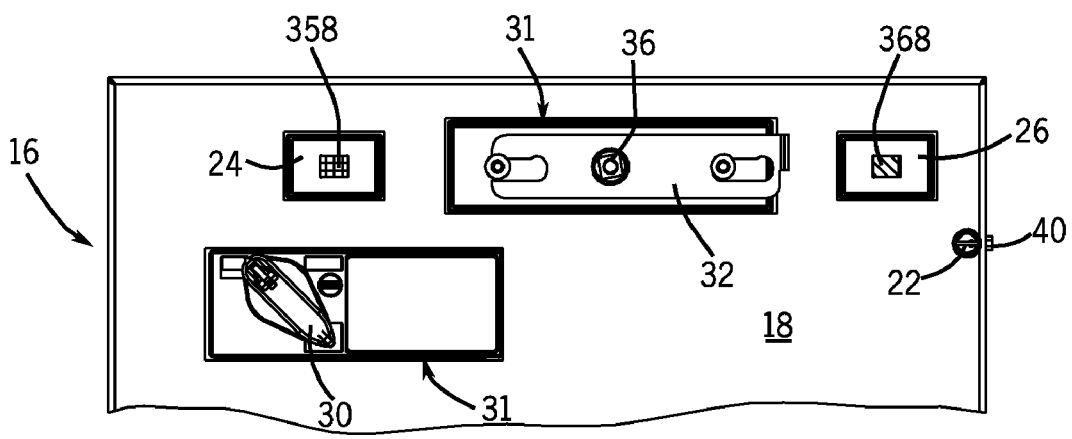
FIG. 22 is a front view of the motor control center subunit of FIG. 4.
Figure 23:
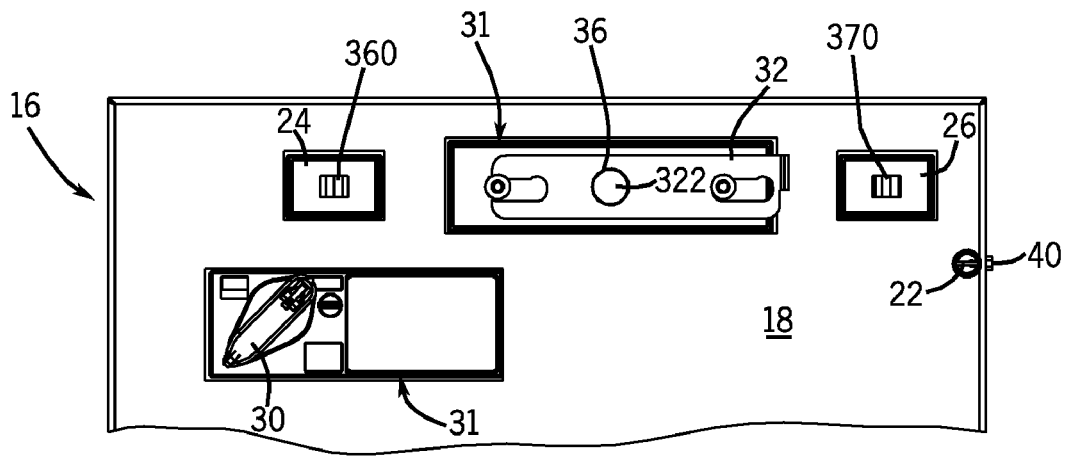
FIG. 23 is a front view of the motor control center subunit of FIG. 5.

Referring now to FIGS. 21-23, the status indicating features of stab indicator 24 and shutter indicator 26 are shown. That is, FIGS. 21, 22, and 23 are a front view of the bucket 16 shown in FIGS. 3, 4, and 5, respectively. With respect to FIG. 21, a user has moved slide 32 of actuating assembly 31 to the right, exposing opening 36. In alternative embodiments, a user may need to unlock a cover or padlock (not shown)

which restrict movement of or access to the slide 32. As shown, slide 32 overlaps door 18, preventing a user from opening door 18 while opening 36 is exposed. Shutter indicator 26 is displaying a green "shutters closed" status 368, since the shutters 56 are closed due to the stabs retracted position 42 of FIG. 3. Therefore, FIG. 21 also shows stab indicator 24 displaying a green "stabs retracted" status, corresponding to the stabs retracted position 42 of FIG. 3. FIG. 22 also shows the green "shutters closed" status 368 on shutter indicator 24, but shows a yellow "test position" status on the stab indicator 24, corresponding to the test position 43 of FIG. 4.

FIG. 23 shows a front view of bucket 16 when the stabs are in the extended/engaged position 45 of FIG. 5. Therefore, shutter indicator 26 now displays a red "shutters open" status 370, since the stabs 46, 48, 50 have separated the shutters 56 (FIG. 5), and the stab indicator 24 of FIG. 23 shows a red "stabs engaged" status 360. Circuit breaker handle 30 has been turned, closing the circuit breaker 31 and permitting the flow of supply power to motor control components inside bucket 16. As described above with respect to FIG. 20, turning circuit breaker handle 30 when the stabs are engaged causes interlock plate 322 to be shifted by movement of circuit breaker fin 346. Accordingly, FIG. 23 illustrates that actuating assembly opening 36 is now obscured by interlock plate 322. It is understood that further measures, such as padlocking a cover over actuating mechanism 31 and slide 32, may also be made to further restrict access to the actuating mechanism 31 when the bucket 16 is connected to supply power.

Figure 24:
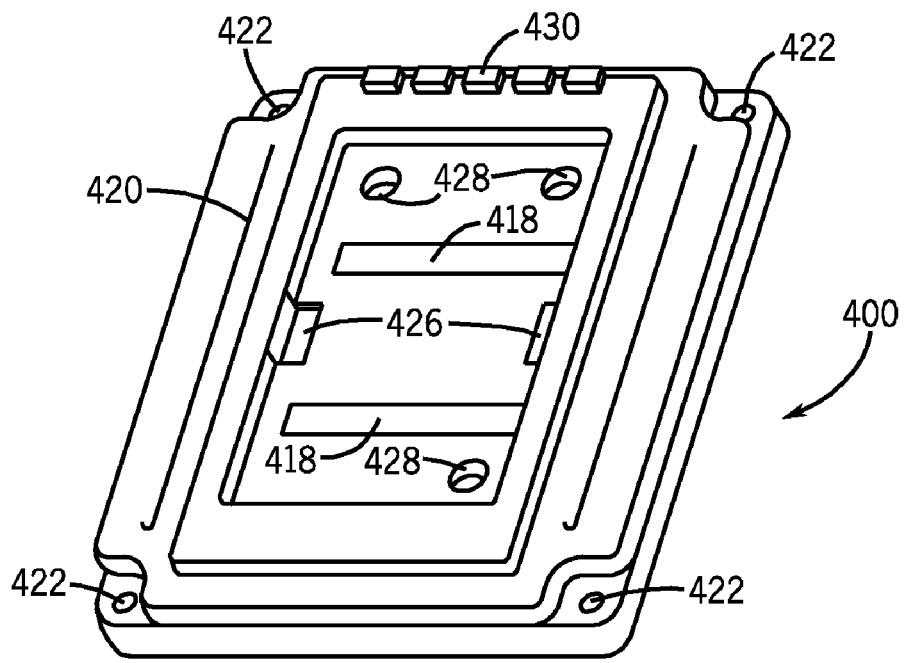
FIG. 24 is a front perspective view of a base module assembly.

Referring now to FIG. 24, the front side 420 of a base module 400 is shown. Mounting holes 422 are located at the corners of the base module 400. In the current embodiment, fasteners (not shown) are used to removably mount base module 400 to the door 18 of a control module 11, however, it is contemplated that other permanent or removable mounting means may be used to attach base module 400 to a bucket 11. Also disposed in base module assembly 400 are internal test point connection ports or pass-through connection ports 418, which form an interface between an accessory 432 and locations of interest within the motor control center 10. Alignment holes 428 and accessory snap lock holes 426 are provided to position and secure an accessory 432 to the base module 400.

Referring now to FIG. 25, an indicator accessory 432 is shown interfaced with base module assembly 400 via snap lock tabs 434. As shown, indicator accessory 432 is provided with illuminated indicators 436 for displaying operating conditions of the motor control center 10 as well as internal characteristics of the accessory 432. For example, an indicator 436 may display a blown fuse signal, a low battery signal, or an indication that the accessory 432 is or is not properly connected to the base module 400. Further, indicator 436 may display information regarding connections within the motor control center 10 or bucket 11 including the load side of a short circuit protection device within the bucket 11, the load side of a starter, control power, bucket ground, and the like. It is also envisioned that indicator 436 comprise a 3 LED arrangement for indicating presence of a 480 VAC voltage and that indicator accessory 432 be used in association with "test before touch" and "live-dead-live" testing practices when accessing motor control centers.

In addition to using a simple indicator 436 as an accessory, it is contemplated that more advanced accessories 432 may also be included. For example, accessory 432 may also be a motor megger unit, a motor wellness unit, or other diagnostic devices.

As known in the art, moisture, contamination, and heat can combine to break down motor winding insulation, shorten motor life, and possibly result in motor failure. A motor megger or mega-ohm meter is an automatic insulation resistance tester that monitors insulation characteristics within the motor. Operating as a circuit tester, the motor megger puts high voltage at a low current across two conductors to ensure the conductors are properly insulated. Thus, in embodiments in which accessory 432 is a motor megger unit, internal test connections of the system may be attached at terminal connects (not shown) positioned on a back surface of the motor megger.

Motor wellness characteristics refers to the wellness of contactors and motor starters and other components within the motor. Contactors are generally used in motor starter applications to switch on/off a load as well as to protect a load, such as a motor, or other electrical devices from current overloading. As such, a typical contactor has three contact assemblies—a contact assembly for each phase or pole of a three-phase electrical device. Each contact assembly, in turn, includes a pair of stationary contacts and a pair of moveable contacts. One stationary contact will be a line side contact and the other stationary contact will be a load side contact. The moveable contacts are controlled by an actuating assembly comprising a contact carrier and an armature magnet assembly which is energized by a coil to move the moveable contacts to form a bridge between the stationary contacts. When the moveable contacts are engaged with both stationary contacts, current is allowed to travel from the power source or line to the load or electrical device. When the moveable contact is separated from the stationary contacts, an open circuit is created and the line and load are electrically isolated from one another.

Despite their relative durability, all contactors have a finite useable life. Component wear, contact surface erosion, friction, jam, contact welding, arc-generated debris, and other factors limit the length of time and/or number of operations through which a contactor may be used. Since contactors and motor starters are important components of both automation and control systems, monitoring their remaining useable life, or "wellness," to predict impending faults before occurrence is essential. A motor wellness module monitors performance of such components by measuring various currents and voltages in one or both of a switched line and an actuating coil to determine indications of impending faults of the device. Accordingly, it is recognized that the internal test point connections provided at base module 400 may be adapted for use with a particular accessory 432. Alternatively, the test point connections may be universal, in which case an accessory 432 may be configured to interface with only those connection ports 418.

Referring now to FIGS. 26-27, another embodiment of base module 400 and accessory 448 is shown, where accessory 448 is permanently integrated with base module 400. In this embodiment, accessory 448 is a voltage test point accessory having a front surface 442 with accessory connection holes 438 within which a user can insert test probes (not shown). Accessory connection holes 438 are access points for testing of various internal voltage readings such as bucket ground, load side of the short circuit protection device, load side of a starter, and bucket control power. The access points 438 are covered by a shutter system 440 to prevent accidental contact with bucket components. Although voltage test point accessory 448 is shown in FIGS. 26 and 27 as an integrated accessory, the voltage test point accessory 448 may also be configured to be detachable from the base module 400 as shown with respect to accessory 432. Furthermore, although accessory 448 is shown in FIG. 28 as having only accessory connection holes 438, it is contemplated that the accessory 448 may include any combination of connection holes 438 and illuminated indicators 436 (FIG. 25).

Thus, an interlock system and a through-door testing system have been disclosed, in a number of embodiments. The interlock system coordinates the installation and power connections of a motor control center subunit or bucket. When a user slides the bucket completely into the enclosure of a motor control center, the line contacts or stabs of the bucket are shielded from the bus bars. Once the bucket is inserted into the enclosure, the front door of the bucket must be closed and the circuit breaker must be off/open in order for the operator to have access to the stab actuating mechanism. Additionally, a user may have to unlock a padlock and latch to gain access to the slide and/or actuating mechanism. Once the actuating mechanism opening is exposed, a crank (or motor drive) may be connected thereto. The stab indicator will show a green "stabs-disengaged" status, and the shutter indicator will show a green "shutters-closed" status. As the stabs are initially advanced, an automatic retention latch is triggered to engage the frame of the motor control center and prevent removal of the bucket therefrom. Also, a micro-switch is activated by the initial advancement of the stabs, turning on control power for the motor control components inside the bucket. When the line stabs reach the back of the bucket, but have not moved past the shielding shutters, the bucket is in the "test" position. The stab indicator will show a yellow "test" status, and the shutter indicator will still show a green "shutters-closed" status. When the stabs are advanced further, they will open the shutters, causing the shutter indicator to show a red "shutters-open" status. When the shutters reach and engage the bus bars, the stab indicator will show a red "stabs-engaged" status and the circuit breaker interlock will be tripped. At this point, the circuit breaker will be permitted to close once the user removes the crank or motor from the actuating mechanism. When a user closes the circuit breaker, access to the actuating mechanism will be obscured by a circuit breaker interlock plate. The circuit breaker handle and/or the actuating mechanism slide can be padlocked in place at this point to maintain the engaged, operating state now achieved.

When the interlock system has fully installed the bucket, the through-door connectivity system still allows a user to detect or monitor the internal conditions of the bucket. Moreover, it is understood that the interlock system thus disclosed also coordinates the power disconnection and removal of the bucket from the motor control center, by reverse operation of the aforementioned interlocks and indicators.

While the above base module assembly 400 has been described for use with a motor control center, it is also envisioned that base module assembly 400 be implemented for use with systems that house motor control arrangements that include a motor starter and a free-standing, enclosed panel. Additionally, base module assembly 400 can be implemented for use with combination starters which enclose a breaker/disconnect-fuse and a motor starter.

Accordingly, one embodiment of the present invention includes a motor control center subunit includes a housing and a base module disposed within the housing for through-door electrical connectivity and configured to relay at least one internal electrical condition of the subunit. The motor control center subunit also includes at least one base module accessory removably connectable to the base module and configured to receive at least one internal electrical condition of the subunit. The base module is configured to allow a user to determine at least one internal condition of the subunit to the accessory.

In accordance with another embodiment of present invention, a motor control center includes a motor control center frame having at least one compartment and a motor control center subunit constructed to seat in the at least one compartment of the motor control center frame. The motor control center also includes an actuating mechanism attached to the motor control center subunit to control movement of a plurality of conductive line contacts and a subunit tester configured to relay a condition of the conductive line contacts outside the subunit to a user.

In another embodiment of the present invention, a method of manufacturing a base module for a motor control center includes the steps of constructing a motor control center subunit to seat within a motor control center and constructing a front panel for the motor control center subunit. The method also includes the steps of disposing a base module within the front panel and attaching test point connectors between the base module and at least one internal component of the motor control center subunit to convey signals indicative of operation conditions of the motor control center subunit.

The present invention has been described in terms of the preferred embodiment, and it is recognized that equivalents, alternatives, and modifications, aside from those expressly stated, are possible and within the scope of the appending claims.

What is claimed is:

1. A motor control center subunit comprising:
   a housing;
   a base module disposed within a panel of the housing for through-door electrical connectivity;
   a plurality of conductive line contacts that are selectively moveable between a retracted position, wherein the plurality of conductive line contacts are retracted within the motor control center subunit, and an extended position, wherein the plurality of conductive line contacts extend outside the motor control center subunit and are engaged with a power bus;
   a test point connector electrically connected between a test point within the motor control center subunit and the base module, the test point connector configured to relay at least one internal electrical condition of the motor control center subunit to the base module;
   at least one base module accessory removably connectable to the base module from outside the housing, the at least one base module accessory configured to receive the at least one internal electrical condition of the motor control center subunit from the base module; and
   wherein the base module accessory is configured to display the at least one internal electrical condition to a user.

2. The motor control center subunit of claim 1 wherein the plurality of conductive contacts are disposed within the housing.

3. The motor control center subunit of claim 2 wherein the plurality of conductive contacts are moveable when the housing is seated in a motor control center and a front panel of the housing is in a closed position.

4. The motor control center subunit of claim 1 wherein the base module accessory is configured to test at least one of an internal current and a motor winding insulation.

5. The motor control center subunit of claim 1 wherein the internal electrical condition of the subunit is a voltage sensed by the test point connector.

6. The motor control center subunit of claim 1 wherein the base module accessory is a motor wellness indicator.

7. The motor control center subunit of claim 1 further comprising a hinged cover attached to the base module and configured to enclose the accessory.

8. The motor control center subunit of claim 7 wherein the hinged cover is clear and the accessory is an indicator.

9. The motor control center subunit of claim 1 wherein the test point connector comprises a wired connection that connects the base module to circuitry located within the motor control center subunit.

10. The motor control center subunit of claim 9 wherein the wired connection is configured to connect to at least one of a line side of a short circuit protection device, a load side of a short circuit protection device, a load side of a starter, a phase current, and a handle mechanism.

11. A motor control center comprising:
a motor control center frame having at least one enclosure;
a motor control center subunit constructed to seat in the at least one enclosure of the motor control center frame;
an actuating mechanism attached to the motor control center subunit to control engagement of a plurality of conductive line contacts with a power bus; and
a subunit tester configured to relay a condition of the conductive line contacts outside the subunit to a user, the subunit tester comprising a test module and an accessory;
wherein the test module is coupled to an exterior panel of the motor control center subunit and is electrically connected to points of interest within the motor control center subunit; and
wherein the accessory is constructed to:
interface with the test module from outside the motor control center subunit to receive electrical signals therefrom; and
display the condition of the conductive line contacts to the user based on the received electrical signals; and
wherein the plurality of conductive line contacts are selectively moveable between a retracted position, wherein the plurality of conductive line contacts are retracted within the motor control center subunit, and an extended position, wherein the plurality of conductive line contacts extend outside the motor control center subunit and are engaged with the power bus.

12. The motor control center of claim 11 wherein the conductive line contacts are moveable when the subunit is seated in a motor control center and a front panel of the subunit is in a closed position.

13. The motor control center of claim 11 wherein the subunit tester is configured to test at least one of an internal current and an internal voltage.

14. The motor control center of claim 11 wherein the accessory comprises one of a motor megger, a motor wellness indicator, and a voltage tester.

15. The motor control center of claim 11 further comprising a hinged cover attached to the test module and configured to enclose the subunit tester, wherein the hinged cover is non-opaque and the accessory is an indicator.

16. The motor control center of claim 11 further comprising electrical connections between the test module and a number of test points of internal motor control center subunit components;
wherein the number of test points comprise at least one of a line side of a short circuit protection device, a load side of a short circuit protection device, a load side of a starter, a phase current, and a handle mechanism;
and wherein the electrical connections are configured to be substantially non-interfering with conditions at the number of test points.

17. A method of manufacturing a subunit for a motor control center comprising:
constructing a motor control center subunit to seat within a motor control center;
disposing a plurality of conductive contacts within the motor control center subunit, the plurality of conductive line contacts selectively moveable between a retracted position, wherein the plurality of conductive line contacts are retracted within the motor control center subunit, and an extended position, wherein the plurality of conductive line contacts extend outside the motor control center subunit and are engaged with a power bus;
constructing a front panel for the motor control center subunit having an interconnect to prevent access to the motor control center subunit when the motor control center subunit is powered;
disposing a base module within the front panel of the motor control center subunit such that at least one connection port of the base module is accessible from outside the motor control center subunit when the front panel is in a closed position; and
attaching test point connectors between the at least one connection port of the base module and at least one internal component of the motor control center subunit to convey signals indicative of operation conditions of the motor control center subunit to a user while the front panel remains in a closed position.

18. The method of manufacturing of claim 17 wherein the test point connectors comprise a temperature sensor and an electrical sensor.

19. The method of manufacturing of claim 17 further comprising:
constructing the base module to receive a test accessory and relay the signals indicative of operation conditions to the test accessory; and
constructing the test accessory to display a visual indication of the signals indicative of operation conditions to the user.

20. The method of manufacturing of claim 18 further comprising configuring the test point connectors to convey operation conditions of the motor control center subunit when the conductive contacts are fully engaged with a supply bus.

21. The method of manufacturing of claim 17 further comprising permanently integrating the base module and the test accessory.

22. The method of manufacturing of claim 17 further comprising forming lug terminals on the internal components of the motor control center subunit to receive the test point connectors.

23. The method of manufacturing of claim 17 further comprising outfitting the test accessory with a shutter system to prevent unintentional operator contact with the signals indicative of operation conditions of the motor control center subunit.

24. A method of manufacturing a subunit for a motor control center comprising:
constructing a motor control center subunit to seat within a motor control center;
constructing a front panel for the motor control center subunit having an interconnect to prevent access to the motor control center subunit when the motor control center subunit is powered;
disposing a base module within the front panel of the motor control center subunit such that at least one connection port of the base module is accessible from outside the motor control center subunit when the front panel is in a closed position; and attaching test point connectors between the at least one connection port of the base module and at least one internal component of the motor control center subunit to convey signals indicative of operation conditions of the motor control center subunit to a user while the front panel remains in a closed position, wherein the test point connectors comprise a temperature sensor and an electrical sensor.

25. A method of manufacturing a subunit for a motor control center comprising:
constructing a motor control center subunit to seat within a motor control center;
constructing a front panel for the motor control center subunit having an interconnect to prevent access to the motor control center subunit when the motor control center subunit is powered;
disposing a base module within the front panel of the motor control center subunit such that at least one connection port of the base module is accessible from outside the motor control center subunit when the front panel is in a closed position;
attaching test point connectors between the at least one connection port of the base module and at least one internal component of the motor control center subunit to convey signals indicative of operation conditions of the motor control center subunit to a user while the front panel remains in a closed position; and
outfitting a test accessory with a shutter system to prevent unintentional operator contact with the signals indicative of operation conditions of the motor control center subunit.

26. A motor control center subunit comprising:
a housing;
a base module disposed within a panel of the housing for through-door electrical connectivity;
a test point connector electrically connected between a test point within the motor control center subunit and the base module, the test point connector configured to relay at least one internal electrical condition of the motor control center subunit to the base module;
at least one base module accessory removably connectable to the base module from outside the housing, the at least one base module accessory configured to receive the at least one internal electrical condition of the motor control center subunit from the base module; and
wherein the base module accessory is configured to display the at least one internal electrical condition to a user; and
wherein the test point connector comprises a temperature sensor and an electrical sensor.

27. A motor control center subunit comprising:
a housing;
a base module disposed within a panel of the housing for through-door electrical connectivity;
a test point connector electrically connected between a test point within the motor control center subunit and the base module, the test point connector configured to relay at least one internal electrical condition of the motor control center subunit to the base module;
at least one base module accessory removably connectable to the base module from outside the housing, the at least one base module accessory configured to receive the at least one internal electrical condition of the motor control center subunit from the base module; and
wherein the base module accessory is configured to display the at least one internal electrical condition to a user; and
wherein the test point connector comprises a temperature sensor and an electrical sensor; and
wherein the base module accessory comprises a shutter system to prevent unintentional operator contact with signals indicative of operation conditions of the motor control center subunit.

28. A motor control center comprising:
a motor control center frame having at least one enclosure;
a motor control center subunit constructed to seat in the at least one enclosure of the motor control center frame;
an actuating mechanism attached to the motor control center subunit to control engagement of a plurality of conductive line contacts with a power bus; and
a subunit tester configured to relay a condition of the conductive line contacts outside the subunit to a user, the subunit tester comprising a test module and an accessory;
wherein the test module is coupled to an exterior panel of the motor control center subunit and is electrically connected to points of interest within the motor control center subunit via test point connectors;
wherein the accessory is constructed to:
interface with the test module from outside the motor control center subunit to receive electrical signals therefrom; and
display the condition of the conductive line contacts to the user based on the received electrical signals; and
wherein the test point connectors comprise a temperature sensor and an electrical sensor.

29. A motor control center comprising:
a motor control center frame having at least one enclosure;
a motor control center subunit constructed to seat in the at least one enclosure of the motor control center frame;
an actuating mechanism attached to the motor control center subunit to control engagement of a plurality of conductive line contacts with a power bus; and
a subunit tester configured to relay a condition of the conductive line contacts outside the subunit to a user, the subunit tester comprising a test module and an accessory;
wherein the test module is coupled to an exterior panel of the motor control center subunit and is electrically connected to points of interest within the motor control center subunit; and
wherein the accessory is constructed to:
interface with the test module from outside the motor control center subunit to receive electrical signals therefrom; and
display the condition of the conductive line contacts to the user based on the received electrical signals;
wherein the subunit tester comprises a shutter system to prevent unintentional operator contact with the electrical signals.

* * * * *